(12) United States Patent
Kim et al.

(10) Patent No.: US 8,168,353 B2
(45) Date of Patent: May 1, 2012

(54) METHOD OF CURING COLOR FILTER FOR ELECTRONIC DISPLAY USING ELECTRON-BEAM AND METHOD OF FABRICATING COLOR FILTER FOR ELECTRONIC DISPLAY USING THE SAME

(75) Inventors: Jeong Seog Kim, Cheonan-si (KR); Chae Il Cheon, Songpa-gu (KR); Jung Min Cho, Nam-gu (KR); Kyoung Ho Lee, Cheonan-si (KR); Young Hwan Han, Daedeok-gu (KR)

(73) Assignee: Hoseo University Academic Cooperation Foundation, Chungcheongnam-do (KR)

( * ) Notice: Subject to any disclaimer, the term of this patent is extended or adjusted under 35 U.S.C. 154(b) by 457 days.

(21) Appl. No.: 12/362,514

(22) Filed: Jan. 30, 2009

(65) Prior Publication Data

US 2010/0104957 A1    Apr. 29, 2010

(30) Foreign Application Priority Data

Oct. 28, 2008  (KR) .................. 10-2008-0106109

(51) Int. Cl.
*G02B 5/20*    (2006.01)

(52) U.S. Cl. .......................................... 430/7; 430/296
(58) Field of Classification Search .................. None
See application file for complete search history.

(56) References Cited

FOREIGN PATENT DOCUMENTS

| JP | 58-100108 A | * | 6/1983 |
| JP | 59-113404 A | * | 6/1984 |
| JP | 10-268515 A | * | 9/1998 |
| JP | 2002-031710 A | * | 1/2002 |

OTHER PUBLICATIONS

Computer-generated translation of JP 2002-031710 (Jan. 2002).*
Computer-generated translation of JP 10-268515 (Sep. 1998).*
Kim, Jeong Seog et al., "Electron-Beam curing of spin-coated color filter films for plastic substrate applications." The 22$^{nd}$ International Liquid Crystal Conference. Jun. 29-Jul. 4, 2008. p. 884. Hoseo University, Chungnam, Korea.
Kim, Jeong Seog et al., "Electron-beam Curing of Color Filter for Flat Panel Display Applications." 17$^{th}$ World Interfinish Congres & Exposition With 9$^{th}$ ICASE. Jun. 16-19, 2008. p. 44. Haeundae, Busan, Korea.

* cited by examiner

*Primary Examiner* — John A. McPherson
(74) *Attorney, Agent, or Firm* — Saliwanchik, Lloyd & Eisenschenk

(57) ABSTRACT

Disclosed herein is a method of curing a color filter for an electronic display using an electron beam at low temperature. A conventional method of curing the color filter by thermal-heating is not suitable for a process of fabricating next generation flexible displays. In the method of the invention, after a color resist pattern is formed on a substrate, the resist is cured by an electron beam at 100° C. or less. Hence, the method can minimize damage of the substrate while facilitating dimension control of the color pattern and achieving precision of a fine pattern. A method of fabricating a color filter for an electronic display using the method is also disclosed.

13 Claims, 22 Drawing Sheets electron beam

METHOD OF CURING COLOR FILTER FOR ELECTRONIC DISPLAY USING ELECTRON-BEAM AND METHOD OF FABRICATING COLOR FILTER FOR ELECTRONIC DISPLAY USING THE SAME

CROSS-REFERENCE TO RELATED APPLICATION

The present application claims the benefit under 35 U.S.C. §119 of Korean Patent Application No. 10-2008-0106109, filed Oct. 28, 2008, which is hereby incorporated by reference in its entirety.

BACKGROUND OF THE INVENTION

1. Field of the Invention

The present invention relates to a method of curing a color filter for an electronic display using an electron beam at low temperature. The present invention relates to a technique that employs an electron beam for curing a color filter at low temperature instead of curing the color filter by thermal-heating as in the prior art.

2. Description of the Related Art

A color filter module is mainly used in the field of thin film transistor liquid crystal displays (TFT-LCDs) and plasma display panels (PDPs), and is also applied to white organic light emitting diodes (OLEDs) that include a color filter.

In LCDs, PDPs or OLEDs, the color filter is generally produced by forming a black matrix pattern on a glass substrate and forming patterns of red, green and blue colors on the black matrix pattern.

Meanwhile, flexible displays have been actively studied in recent years as a next generation display technology. For the flexible display, since it is a key point to secure flexibility of the display, the glass substrate cannot be used and must be replaced with a plastic substrate. However, the plastic substrate is very vulnerable to heat, and provides many restrictions in fabrication of the color filter.

FIG. 1 is a flowchart of a conventional method of fabricating a color filter.

Referring to FIG. 1, a substrate is cleaned in S10. Here, cleaning is performed by ultraviolet irradiation, ozone, plasma or acid.

Next, a black matrix resin or color resist is coated on the substrate in S20. Here, coating is performed by spin coating or slit coating.

Then, the black matrix resin or color resist is dried in S30, followed by bead removal in S40.

Then, the entirety of the substrate is preheated in S50. At this time, the substrate is preheated to 30~90° C.

Then, exposure and development processes are performed in S60 and S70. Here, the development process in S70 is performed at room temperature.

Then, the entirety of the substrate is cleaned in deionized water in S80.

Next, a black matrix resin or color resist pattern formed in the exposure and development processes in S60 and S70 is dried in S90, followed by curing in S95.

Typically, the color filter refers to a module that has a black matrix pattern and patterns of red, green and blue colors coated together on a substrate. Accordingly, the color filter is obtained by repeating an operating cycle from the substrate cleaning process in S10 to the curing process in S95 to sequentially form the black matrix resin pattern, the red pattern, the green pattern, and the blue pattern as described above.

FIGS. 2a to 2e are cross-sectional views illustrating the conventional method of fabricating the color filter.

Referring to FIG. 2a, a substrate 15 for a color filter is cleaned. Here, the substrate can be a glass substrate or plastic substrate, and is cleaned by ultraviolet irradiation or ozone.

Referring to FIG. 2b, a black matrix pattern 25 is formed on the substrate 15. Here, patterning the substrate is performed according to the operating cycle as described in FIG. 1.

Referring to FIG. 2c, a red pattern 35 is formed and cured on the black matrix pattern 25 and the substrate 15.

Referring to FIG. 2d, a green pattern 45 is formed and cured on the black matrix pattern 25 and the substrate 15.

Referring to FIG. 2e, a blue pattern 55 is formed and cured on the black matrix pattern 25 and the substrate 15.

Here, a process of curing a color filter for LCDs or OLEDs, that is, a baking process, is generally performed by thermal-heating in an electric oven or by ultraviolet irradiation.

Currently, when forming the color filter on the glass substrate, thermal curing is performed at about 200° C., and thus can be performed in the electric oven without any problem.

However, the plastic substrate requires a continuous temperature of 100° C. or less.

As described in FIG. 1 or FIGS. 2 to 2e, since the substrate is heated at about 200° C., the plastic substrate is deformed due limitations in terms of physical and mechanical properties, thereby making it difficult to achieve dimension control of the color filter module and precision of a fine pattern.

Furthermore, the curing process using ultraviolet rays and heat requires additives such as a photo-initiator in addition to a binder resin and a cross-linkable monomer for forming the color patterns, thereby deteriorating production efficiency.

FIG. 3 is a diagram illustrating synthesis of polymer materials constituting a color filter according to a conventional technique.

Referring to FIG. 3, a photo-initiator 3 is added to a binder resin 1, a cross-linkable monomer 5, and other additives 7. Herein, the photo-initiator refers to a material that generates radicals by UV and heat during an exposure process, and causes polymerization of the cross-linkable monomer 5 to form a polymer material 9 constituting a color filter. Thus, it is necessary to have a process of controlling the added amount of photo-initiator, which can cause deterioration of the production efficiency.

As described above, when UV or heat is used for the curing process in fabrication of the color filter on the plastic substrate for flexible displays, the limits in terms of physical and mechanical properties of the plastic substrate cause deformation of the plastic substrate, and make it difficult to control the dimensions of the color filter module and to achieve precision of a fine pattern. Furthermore, the photo-initiator must be used to achieve UV or thermal polymerization, thereby deteriorating production efficiency.

BRIEF SUMMARY

The present invention is conceived to solve the problems of the conventional technique, such as thermal deformation of a plastic substrate, difficulty in achieving dimension control of a color filter and precision of a fine pattern, and the like. Hence, an aspect of the present invention is to provide a method of curing a color filter at low temperature using an electron-beam, in which an acrylate monomer or oligomer is employed as a resist for forming a pattern of color filters and a black matrix pattern to ensure effective electron beam polymerization. Another aspect of the present invention is to provide a method of fabricating a color filter for an electronic display using the method of the invention.

A further aspect of the present invention is to provide a polymerization condition and technique than enables electron-beam curing to be effectively applied to a color filter having a thickness of about 1.5 µm.

In accordance with an aspect of the present invention, a method of curing a color filter for an electronic display using an electronic beam at low temperature is provided. The method includes: forming a red pattern, a green pattern, a blue pattern, or a black matrix pattern on a substrate; and irradiating an electron beam to the red pattern, the green pattern, the blue pattern, or the black matrix pattern at an energy of 0.01~3 MeV and an irradiation amount of 10~500 kGy in the range of room temperature to 100° C. to perform a curing process.

The substrate may be a glass or plastic substrate having a thickness of 80~3,000 µm. The red pattern, the green pattern, the blue pattern, or the black matrix pattern may be formed by an exposure process using an electron beam or ultraviolet (UV) irradiation. The red pattern, the green pattern, the blue pattern, or the black matrix pattern may be formed to a thickness of 1.5~1.7 µm. The electron beam may be irradiated from above the red pattern, the green pattern, the blue pattern, or the black matrix pattern toward the substrate. A transparent Teflon (polytetrafluoroethyelene) plate, plastic plate or glass plate may be disposed above the red pattern, the green pattern, the blue pattern, or the black matrix pattern to adjust the energy of the electron beam. The transparent Teflon plate, plastic plate or glass plate may have a thickness of 10~2,100 µm, and a total number of 0 to 7 Teflon plates, plastic plates or glass plates may be provided. The electron beam may be irradiated from a rear side of the substrate to the red pattern, the green pattern, the blue pattern, or the black matrix pattern through the substrate. While the electron beam is irradiated, an inert gas comprising nitrogen or argon may be brought into contact with a surface of the red pattern, the green pattern, the blue pattern, or the black matrix pattern.

In accordance with another aspect of the present invention, a method of fabricating a color filter for an electronic display is provided. The method includes coating a resist for forming the color filter on a substrate; pre-baking the resist; exposing and developing the pre-baked resist to form a color filter pattern; and irradiating an electron beam to the color filter pattern at an energy of 0.01~3 MeV and an irradiation amount of 10~500 kGy in the range of room temperature to 100° C. to perform a curing process.

In accordance with a further aspect of the present invention, a method of fabricating a color filter for an electronic display is provided. The method includes coating a resist for forming the color filter on a substrate; pre-baking the resist; exposing and developing the pre-baked resist to form a color filter pattern; and irradiating an electron beam at an energy of 0.01~3 MeV and an irradiation amount of 10~500 kGy in the range of room temperature to 100° C. to perform a curing process, the electron beam being irradiated from a rear surface of the substrate where the resist is not formed, to the color filter pattern through the substrate.

In accordance with yet another aspect of the present invention, a method of fabricating a color filter for an electronic display is provided. The method includes coating a resist for forming the color filter on a substrate; pre-baking the resist; exposing the pre-baked resist to form a color filter pattern while irradiating an electron beam at an energy of 0.01~3 MeV and an irradiation amount of 10~500 kGy to the color filter pattern in the range of room temperature to 100° C. to perform an exposure process and a curing process at the same time; and removing the resist except for the color filter pattern by a development process.

Here, the resist may include an acrylate monomer or oligomer.

In accordance with yet another aspect of the present invention, a color filter for an electronic display fabricated by the method of the present invention is provided.

BRIEF DESCRIPTION OF THE DRAWINGS

The above and other aspects, features and advantages of the present invention will become apparent from the following description of exemplary embodiments given in conjunction with the accompanying drawings, in which.

DETAILED DESCRIPTION

Exemplary embodiments of the present invention will be described in detail with reference to the accompanying drawings hereinafter. Here, it should be noted that the present invention is not limited to the following embodiments and can be realized in various forms. The embodiments are given for complete disclosure of the present invention and complete understanding of the present invention by a person having ordinary knowledge in the art. The present invention is limited only by the accompanying claims.

To solve the problems of the conventional technique, such as thermal deformation of a plastic substrate, difficulty in achieving dimension control of a color filter and precision of a fine pattern, and the like, in fabrication of a color filter for a flexible display, the present invention introduces a method of curing the color filter using an electron-beam for enabling low temperature curing at 100° C. or less, instead of a conventional thermal curing method, and provides polymer materials used for fabrication of the color filter and suitable for the electron-beam curing.

Additionally, the present invention employs acrylate monomers or oligomers as cross-linkable monomers for a color filter and a black matrix, and provides a polymerization condition and technique suitable for a color filter having a thickness of about 1.5 μm in application of the electron-beam curing.

Next, a method of curing a color filter for an electronic display using an electron beam at low temperature according to the present invention will be described in detail.

A color filter module according to one embodiment of the invention is fabricated to include a red pattern, a green pattern, a blue pattern, and a black matrix pattern for pixels.

Here, the patterns are formed to have a resolution of at most 2 μm. A material for the patterns is a color resist, and particularly, a negative color resist that is typically used as a photosensitive pigment dispersion liquid prepared by dispersing a pigment in a photosensitive resin.

The black matrix pattern is one component constituting the color filter, and is formed by forming a pattern with a chrome (Cr) or chrome oxide (CrO) thin film or with a polymer resin-based photosensitive resist. At this time, since the same exposure and development processes are also used in a subsequent process of forming the color patterns, the use of the photosensitive resist can simplify the manufacturing process.

Additionally, according to the invention the material for the color patterns is a negative photoresist. Here, since binders and cross-linkable monomers constituting the black matrix and the color patterns are similar, it is possible to apply electron beam curing to all of them.

Figure 1:
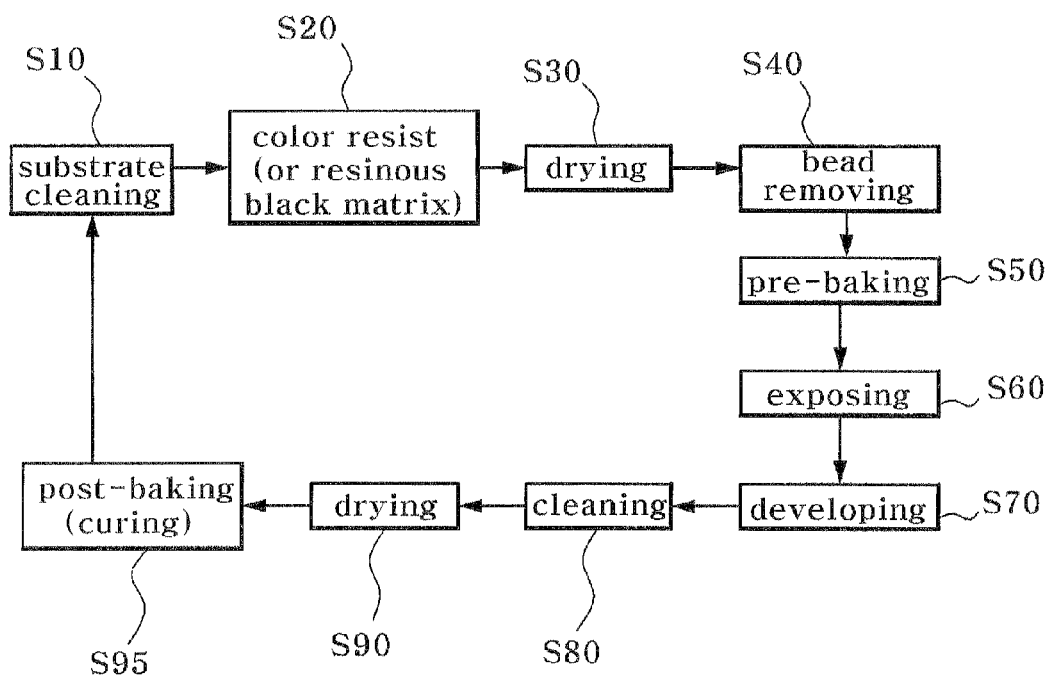
FIG. 1 is a flowchart of a conventional method of fabricating a color filter.
Figure 2A:
FIGS. 2a to 2e are cross-sectional views illustrating the conventional method of fabricating the color filter.
Figure 2B:
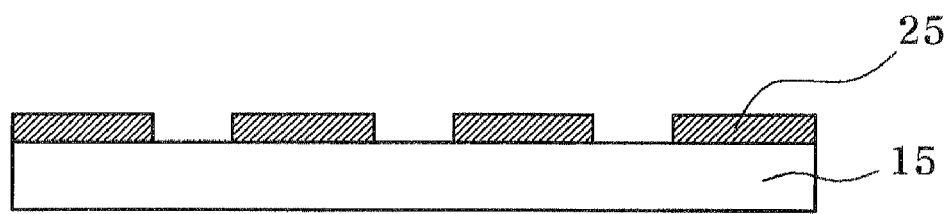
Figure 2C:
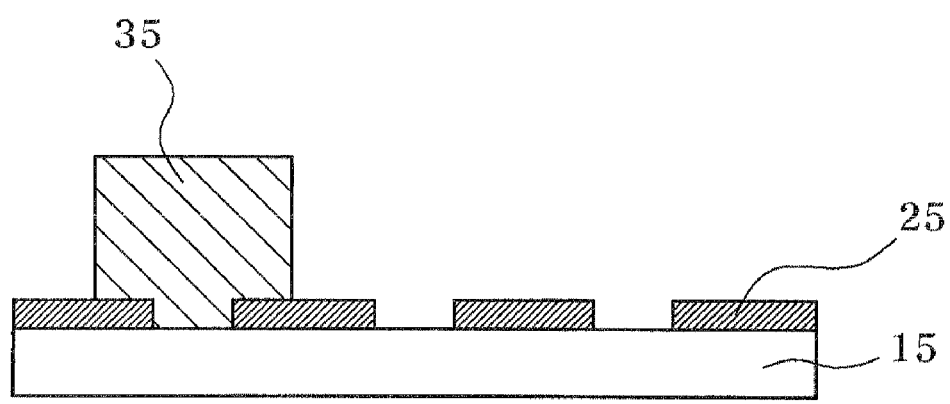
Figure 2D:
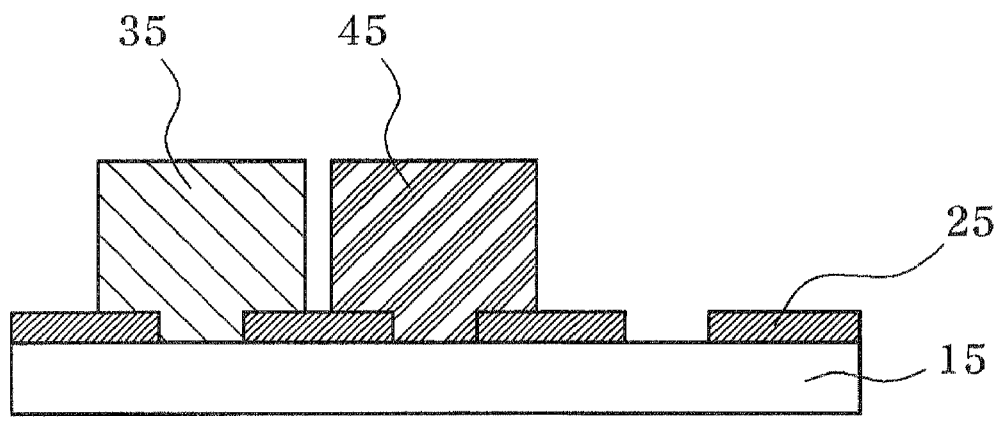
Figure 2E:
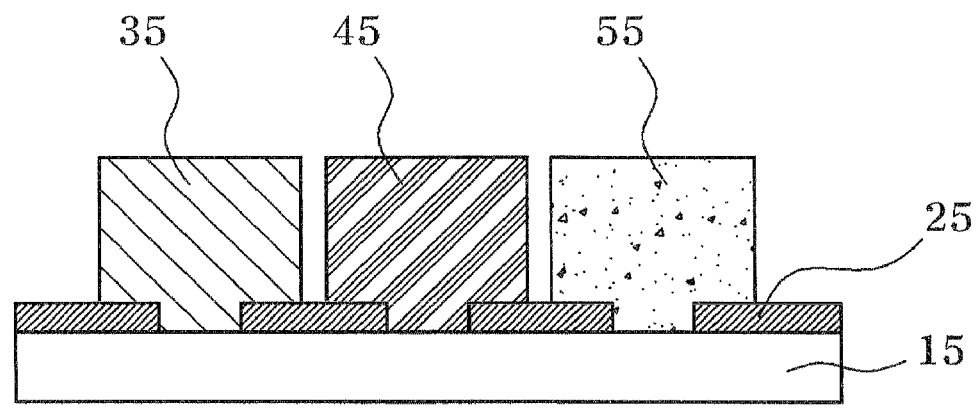
Figure 3:
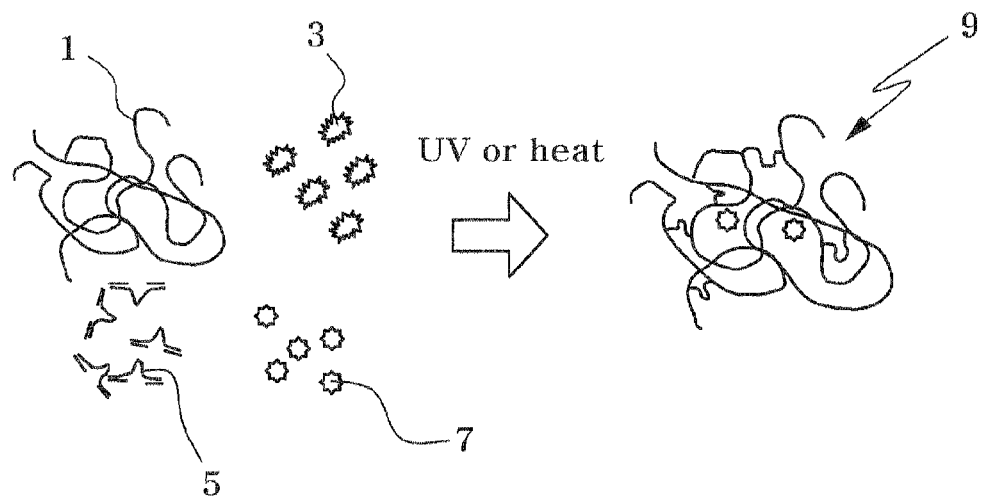
FIG. 3 is a diagram illustrating synthesis of polymer materials constituting a color filter according to a conventional technique.
Figure 4:
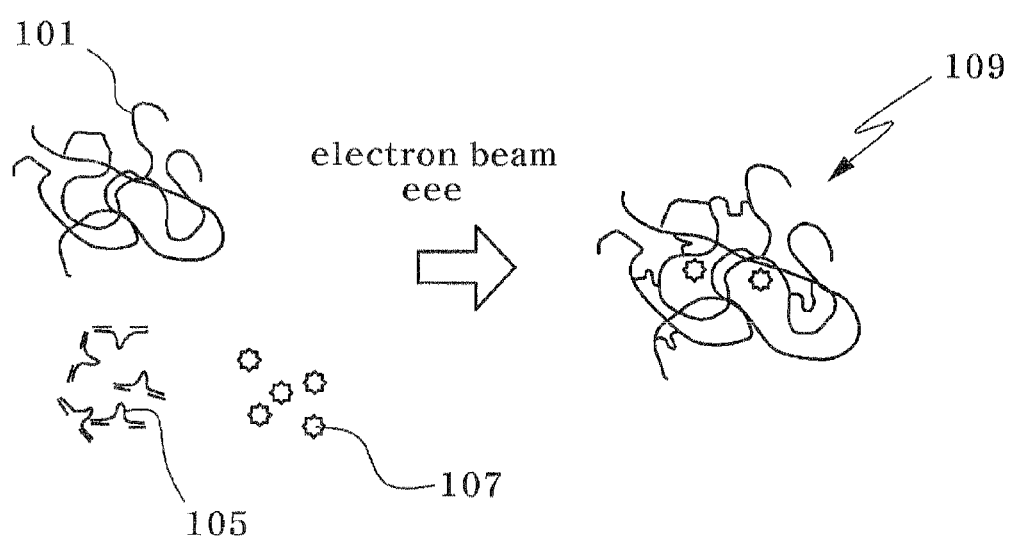
FIG. 4 is a diagram illustrating main components of a color filter according to the present invention, and polymerization thereof by electronic-beam curing.

FIG. 4 is a schematic diagram illustrating main components of a color filter according to the present invention, and polymerization by the electronic-beam curing.

Referring to FIG. 4, first, a binder polymer 101 is prepared. The binder polymer 101 serves as a binder for a pattern formed after an exposure process. That is, the binder is a component that is applied as a base resin of a resist to a substrate and forms a film thereon. The binder acts to introduce an acid group which allows the color filter resist to be dissolved in an alkali liquid developer. The binder polymer 101 is made of PMMA-based polymer materials such as polyethyl methacrylate, polyvinyl naphthalene methacrylate, polybutyl methacrylate, and the like.

A raw material of the binder polymer 101 is synthesized through batch type solution polymerization, in which a monomer for the binder includes benzyl methacrylate that is a polymerizable acid, such as (meth)acrylic acid and the like.

Next, a cross-linkable monomer 105 is prepared. According to the present invention, the cross-linkable monomer 105 is a material which is cured by radicals generated by an electron beam, and serves as a key component in curing the color filter. In this invention, the cross-linkable monomer is a material that causes immediate polymerization by an electron beam without the function of a photo-initiator. The cross-linkable monomer 105 has a great influence on a curing (polymerization) rate, the hardness of a color filter pattern, and the like according to the kind of cross-linkable monomer. Examples of the cross-linkable monomer 105 include acrylate monomers or oligomers such as $(CH_2=CHCOOCH_2)_3-CCH_2CH_3$ and the like.

In addition to the aforementioned components of the color filter, additives 107 and a solvent are used to secure uniformity of color filter patterns and to improve a bonding force between the patterns and the substrate.

Figure 5:
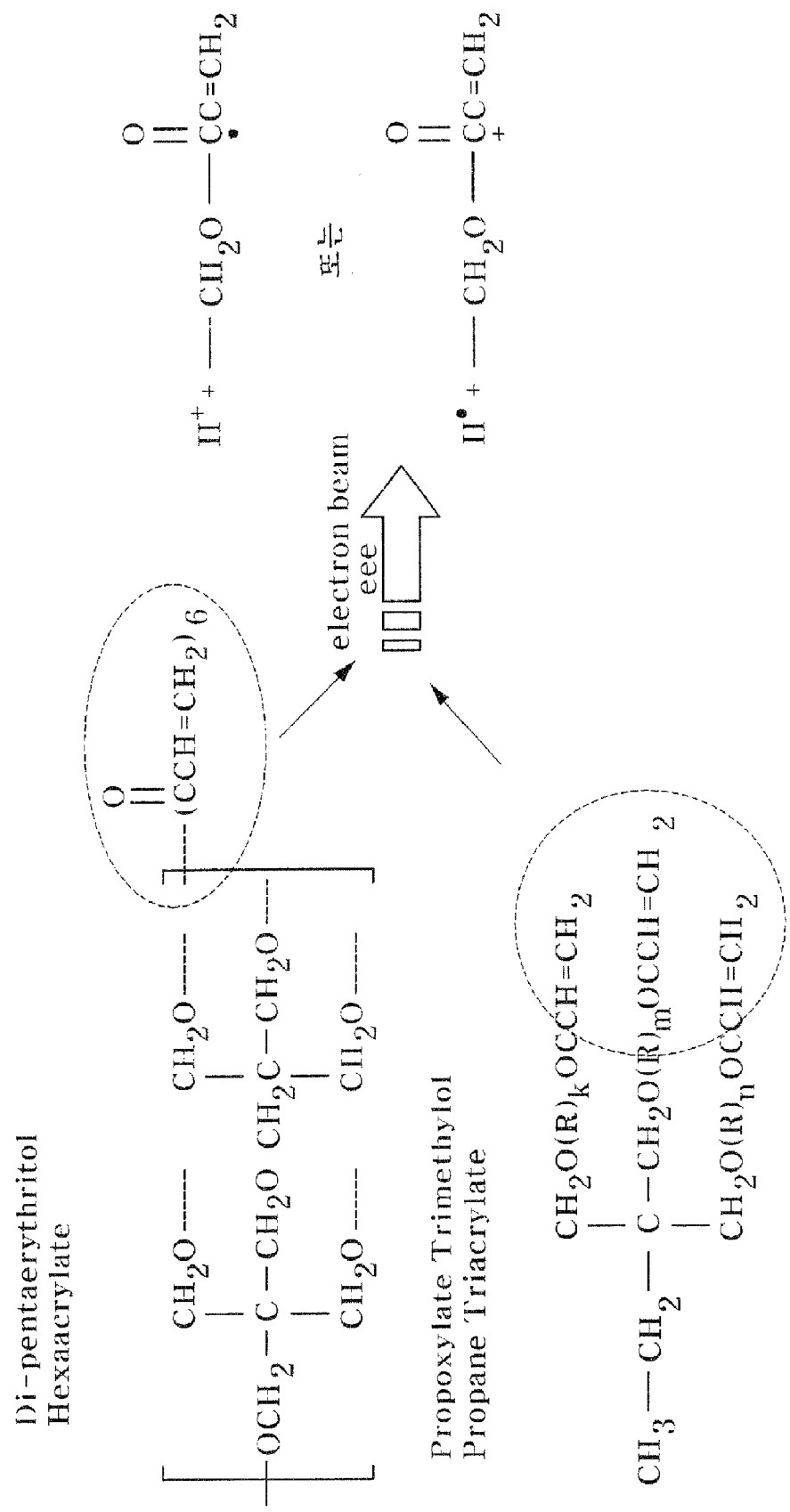
FIG. 5 shows a chemical reaction process of polymerization of acrylate cross-linkable monomers by electron-beam irradiation according to the present invention.

FIG. 5 shows a chemical reaction process of polymerization of acrylate cross-linkable monomers by electron-beam irradiation according to the present invention.

Referring to FIG. 5, double bonds of the acrylate monomers are broken (ionized) to allow polymerization of the monomers to be effectively carried out without the photo-initiator, which is a necessary component in the prior art.

On the other hand, a commercially available resin-based photosensitive resist of a negative type black matrix is mainly composed of an acrylate resin binder similar to that of the color filter. More specifically, the photosensitive resist of the negative type black matrix comprises acrylic polymer dispersers, additives, acrylate cross-linkable monomers, carbon black (particle size of 40~200 nm), and a solvent, thereby exhibiting very similar functions and properties to those of the resist for the color filter. Hence, when an electron beam is irradiated to the cross-linkable monomers of the photosensitive resist, the electron beam causes polymerization, that is, cross-linking, of the cross-linkable monomers and the acrylic polymer, which is provided as a base resin, thereby curing the color filter.

FIGS. 6a to 6d are cross-sectional views illustrating a method of fabricating a color filter for an electronic display according to a first embodiment of the present invention.

Figure 6A:
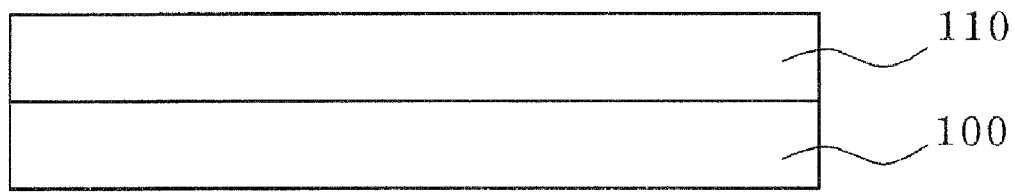
FIGS. 6a to 6d are cross-sectional views illustrating a method of fabricating a color filter for an electronic display according to a first embodiment of the present invention.

Referring to FIG. 6a, a resist 110 for forming a color filter or black matrix is coated on a substrate 100. The substrate may be a glass or plastic substrate having a thickness of 80~3,000 μm.

Figure 6B:
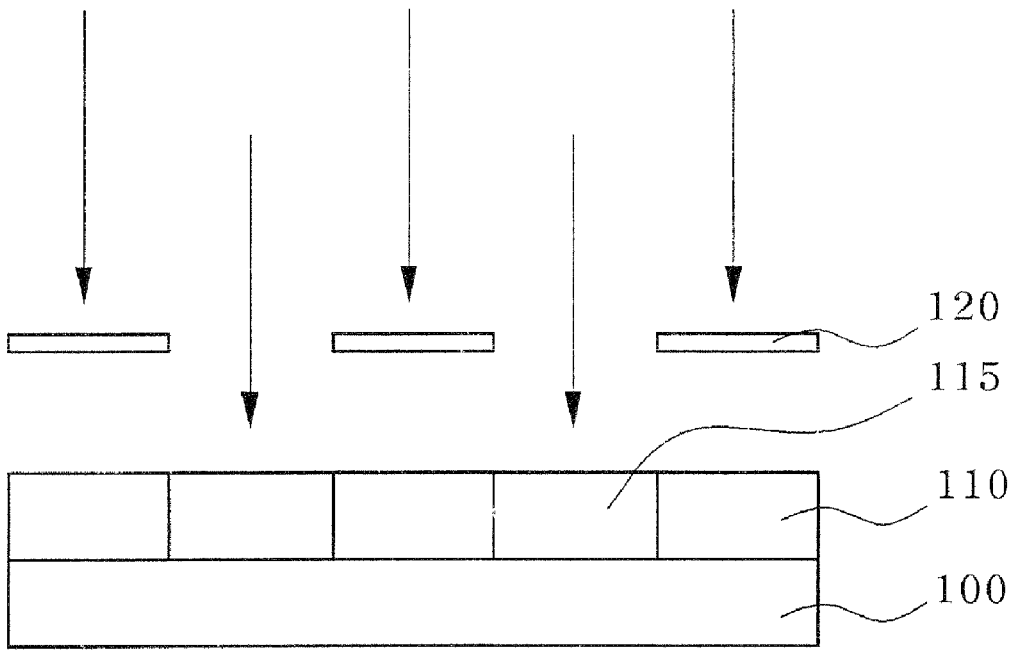

Referring to FIG. 6b, a mask 120 for forming a color filter pattern or black matrix pattern is disposed above the resist 110, followed by an exposure process.

Figure 6C:
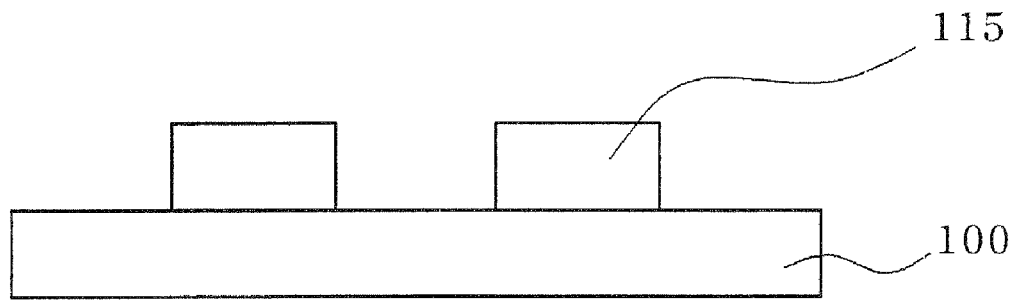

Referring to FIG. 6c, after removing the mask 120, a development process is performed to form a color filter pattern or black matrix pattern 115.

Figure 6D:
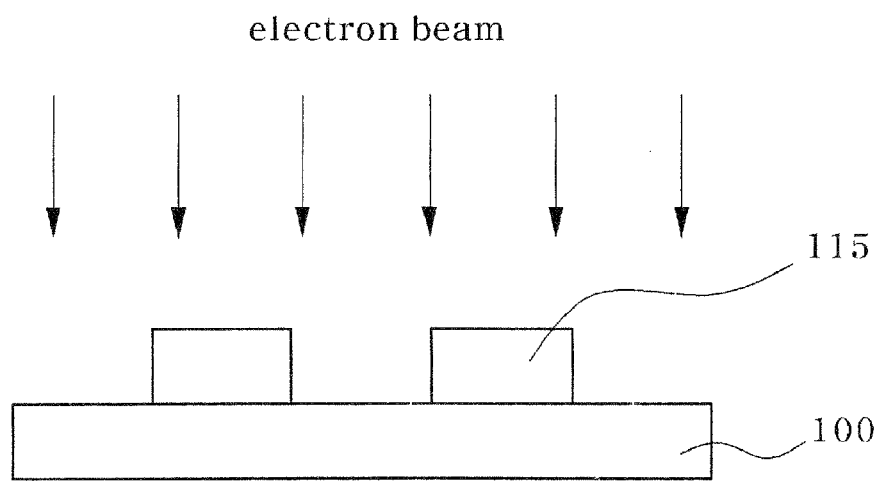

Referring to FIG. 6d, the color filter pattern or black matrix pattern 115 is cured by an electron beam.

Here, the exposure process in FIG. 6b is an optical or UV exposure process. Meanwhile, since the electron beam is used in this invention, it is possible to use the electron beam for the exposure process. In this case, it is possible to reduce the number of processes by performing the exposure process and the curing process at the same time.

Figure 7A:
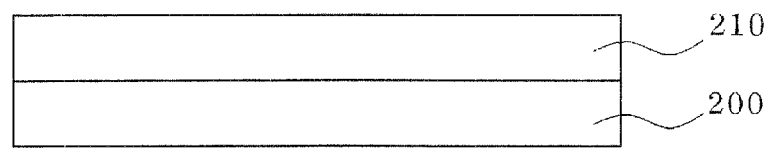
FIGS. 7a to 7c are cross-sectional views illustrating a method of fabricating a color filter for an electronic display according to a second embodiment of the present invention.
Figure 7B:
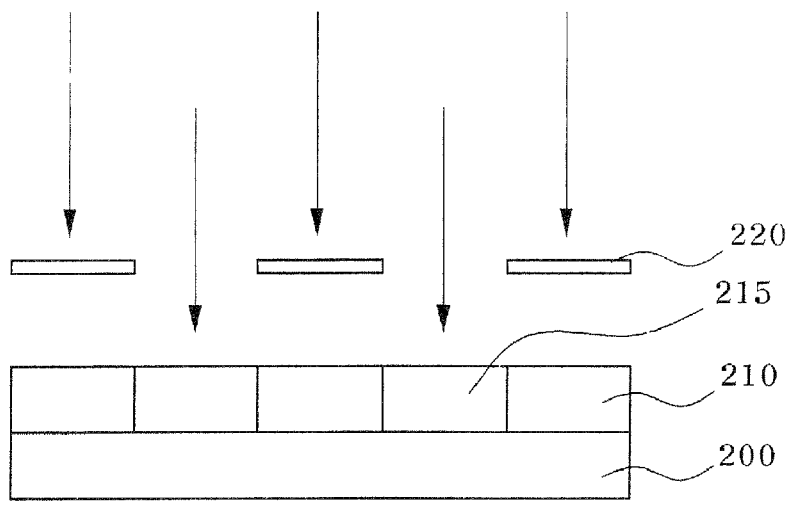
Figure 7C:
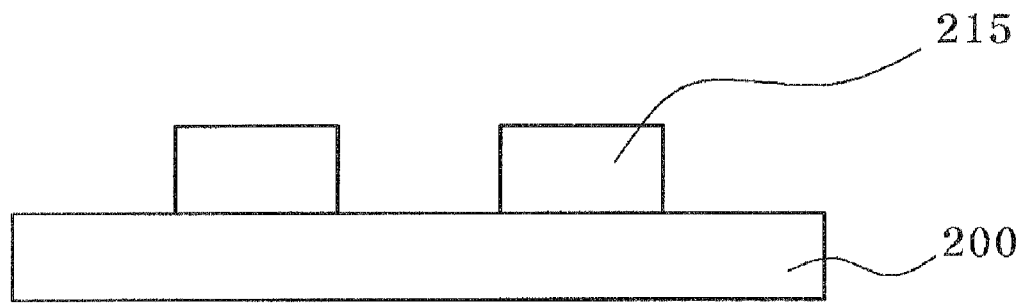

FIGS. 7a to 7c are cross-sectional views illustrating a method of fabricating a color filter for an electronic display according to a second embodiment of the present invention.

In this embodiment, the exposure process and the curing process are performed at the same time.

Referring to FIG. 7a, a resist 210 for forming a color filter or black matrix is coated on a substrate 200. The substrate may be a glass or plastic substrate.

Referring to FIG. 7b, a mask 220 for forming a color pattern or black matrix pattern is disposed above the resist 210, followed by an exposure process. Here, the exposure process is performed using an electron beam. Then, curing is performed by irradiating the electron beam to the resist 210 subjected to the exposure process.

Referring to FIG. 7c, after removing the mask 120, a development process is performed to form a color filter pattern or black matrix pattern 215.

In the above, the method of forming the color filter according to the present invention is described. A detailed condition of each process will be described hereinafter.

Figure 8:
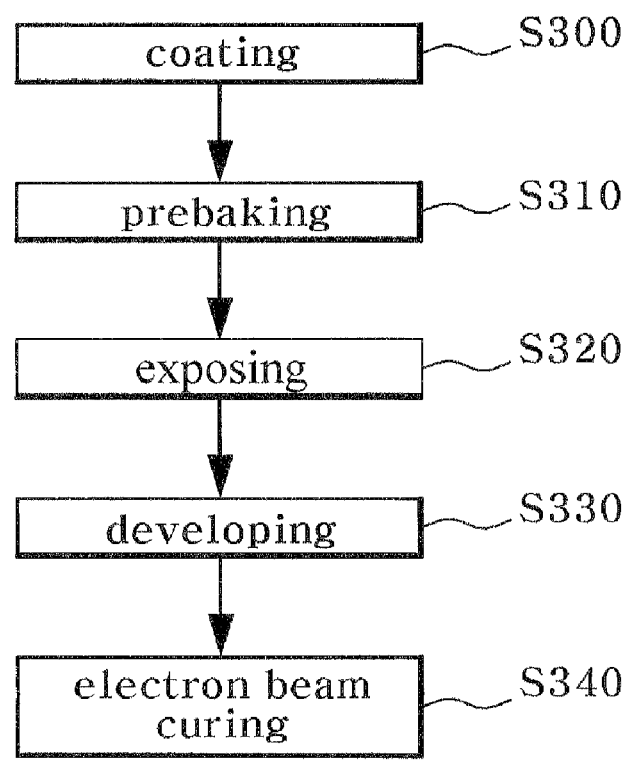
FIG. 8 is a flowchart of the method of fabricating the color filter according to the first embodiment.

FIG. 8 is a flowchart of the method of fabricating the color filter according to the first embodiment, which shows the respective processes of FIGS. 6a to 6d.

Referring to FIG. 8, first, a resist for forming a color filter pattern or black matrix pattern is coated on a substrate in S300. The resist may be coated by spin coating or slit coating. The resist is a negative type resist, which is commercially available, and the coating layer of the resist may be adjusted to a thickness of 1~2 μm.

Additionally, when using the plastic substrate, it is possible to use any plastic substrate, such as polyethylene terephtalate (PET), polyethylene naphtalate (PEN) or polycarbonate (PC), which is commercially available in the market.

Then, the coated resist is pre-baked at 100° C. or less for 1~2 minutes in S310.

Next, the exposure process is performed in S320. When the exposure process is performed using an electron beam, irradiation of the electron beam is performed such that an irradiated part of the resist is cured via polymerization. Here, the electron beam may be adjusted to have an exposure energy of 0.01~3 MeV and an irradiation amount of 10~100 kGy, and the temperature of the substrate may be in the range of room temperature to 100° C.

Next, the non-cured resist is removed by an alkali liquid developer, followed by development to form a color filter pattern or black matrix pattern in S330.

Next, the color filter pattern or black matrix pattern is cured by the electron beam in S340. At this time, the electron beam may be adjusted to have a curing energy of 0.01~3 MeV and an irradiation amount of 10~500 kGy, and the temperature of the substrate may be in the range of room temperature to 100° C.

Figure 9:
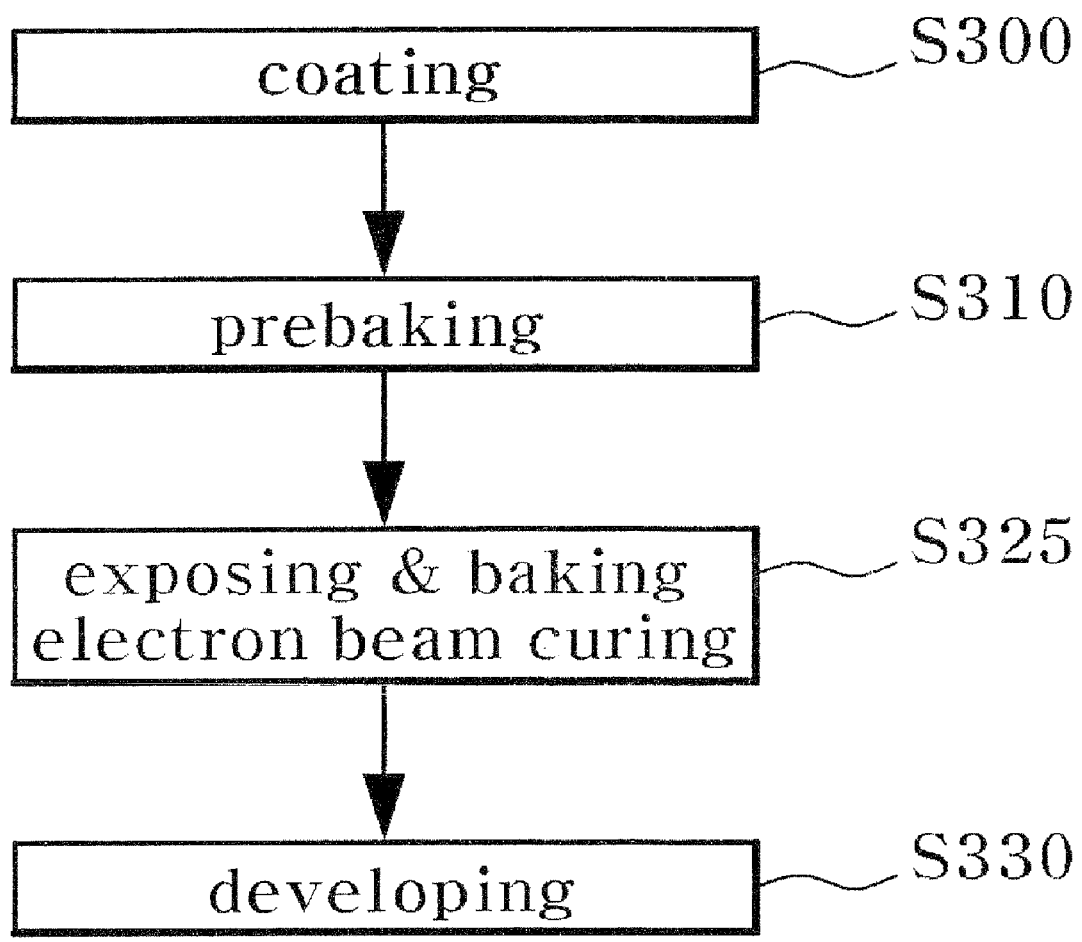
FIG. 9 is a flowchart of the method of fabricating the color filter according to the second embodiment.

FIG. 9 is a flowchart of the method of fabricating the color filter according to the second embodiment, which shows the respective processes of FIGS. 7a to 7c.

Referring to FIG. 9, the processes of coating, pre-baking, and developing the resist for forming the color filter pattern or black matrix pattern on the substrate in S300, S310 and S330 are the same as those of FIG. 8.

However, in this embodiment, the exposure process and the curing process are performed at the same time in S325, thereby reducing the number of processes. At this time, the electron beam may be adjusted to have an exposure and curing energy of 0.01~3 MeV and an irradiation amount of 10~500 kGy, and the temperature of the substrate may be in the range of room temperature ~100° C.

As described above, in the process of fabricating the color filter according to the present invention, curing is performed at 100° C. or less, thereby solving thermal instability of the plastic substrate, which is one problem of the conventional thermal-heating method. Accordingly, the present invention can solve the problem of the conventional technique such as distortion or thermal deformation of the substrate, difficulty in achieving precision of a fine color pattern caused by thermal expansion, and the like.

Figure 10:
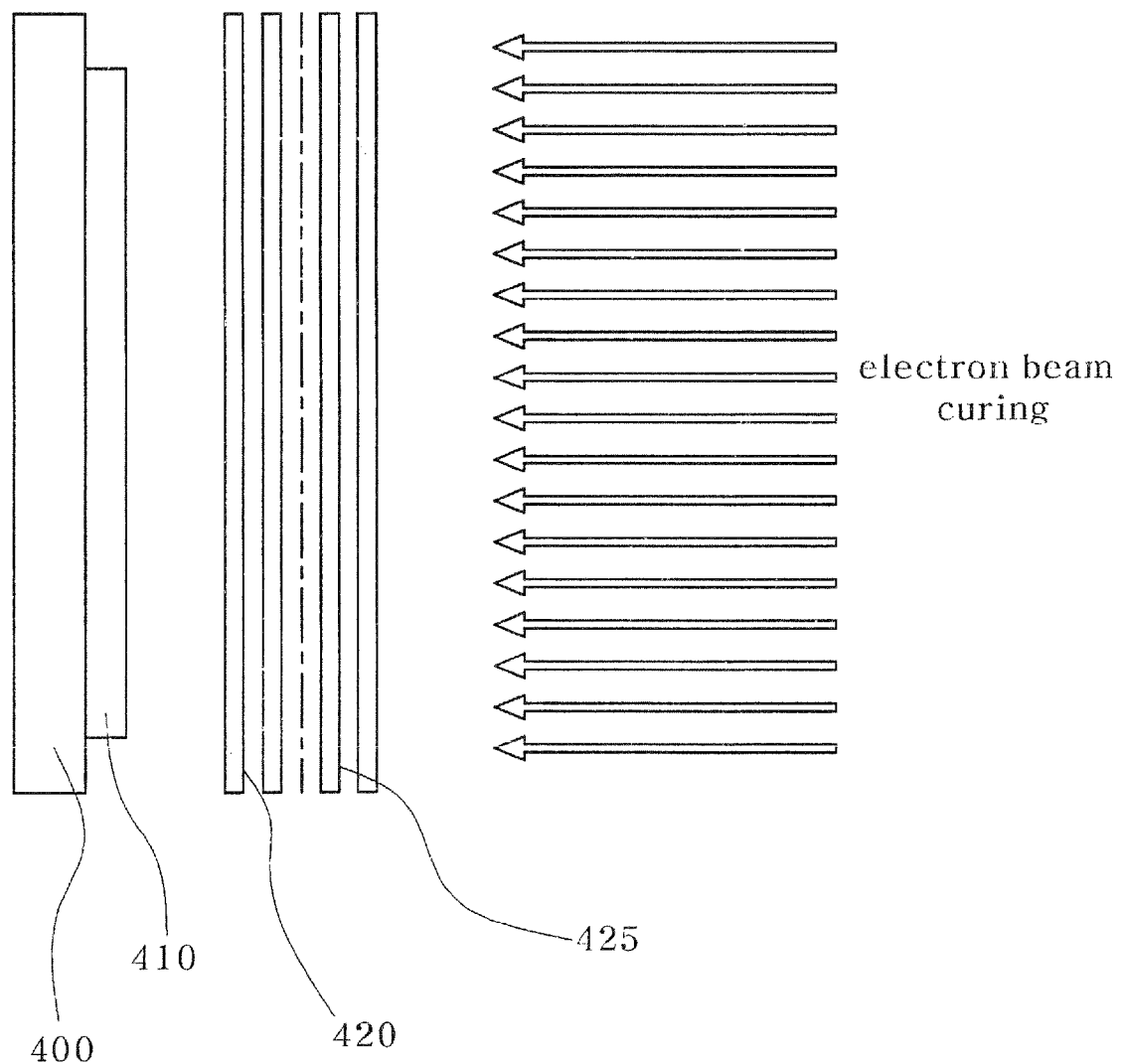
FIGS. 10 and 11 are schematic views illustrating electron beam irradiation directions during electron-beam curing according to the present invention.
Figure 11:
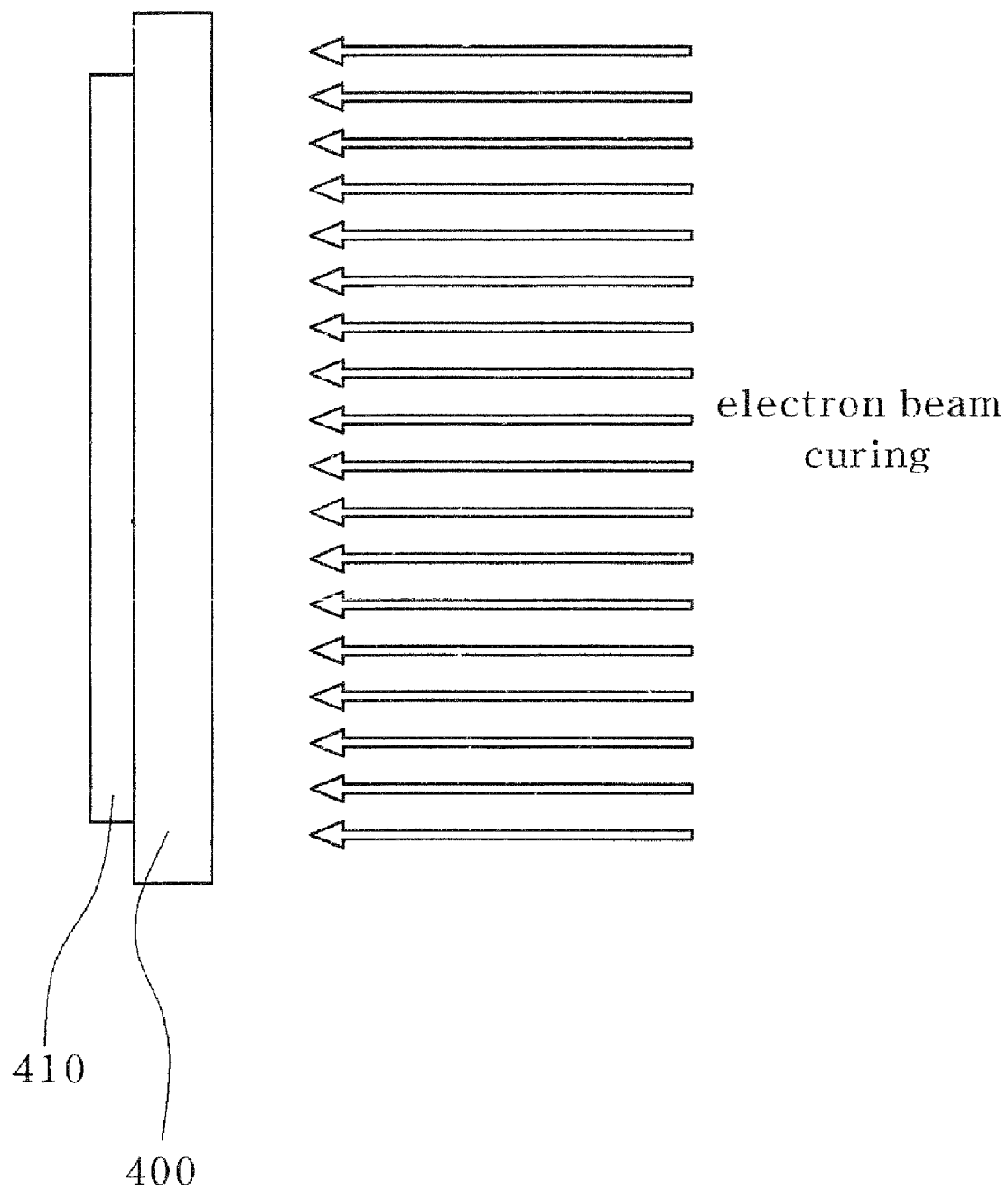

FIGS. 10 and 11 are schematic views illustrating electron beam irradiation directions during electron-beam curing according to the present invention, which shows the most important feature for enabling efficient curing of a color filter.

In FIG. 10, an electron beam is irradiated from above a substrate 400 to a resist 410 for forming a color filter or black matrix pattern coated on the substrate 400, and in FIG. 11, the electron beam is irradiated to the resist 410 from below the substrate 400. Here, the substrate 400 may be one of a glass substrate (Corning glass 1737) and a plastic substrate, and the resist 410 for the color filter or black matrix pattern may have a thickness of 1.5~1.7 μm. Further, the electron beam curing may be performed in a nitrogen and argon atmosphere on the surface of the substrate 400 where the resist 410 is formed.

Referring to FIG. 10, Teflon plates are disposed above the resist 410 in order to adjust an irradiation energy of the electron beam. Here, each of the Teflon plates may have a thickness of 1~300 μm, and 1 to 7 Teflon plates may be provided above the resist 410 so as to achieve a total thickness of 2,100 μm if all present. At this time, the Teflon plates are stacked such that, for example, a first Teflon plate 420 is separated from a second Teflon plate 425.

The aforementioned electron beam curing process according to the present invention will be more clearly understood with reference to the following examples. Table 1 shows sample names (denoted by classification of curing conditions) of resists (hereinafter, color filter samples) for forming a color filter, which are shown in the drawings illustrating effects and results of the invention according to examples.

TABLE 1

Color filter sample names and curing conditions

| Color filter sample name | | Curing conditions |
|---|---|---|
| Thermal-heating | T200 | sample obtained by curing at 200° C. in electric oven as in prior art |
| Coating & drying | NC | sample before irradiation of electron beam (in a coated state) |
| Samples obtained by altering thickness of Teflon layer and direction of electron beam irradiation | TR-PI | nitrogen atmosphere during irradiation of electron beam electron beam irradiated from below a surface of a substrate where a color filter is not coated, that is, from the rear side of the substrate |
| | T0-PI | sample without contacting oxygen, No Teflon plate nitrogen atmosphere during irradiation of electron beam |
| | T1-PI | nitrogen atmosphere, 1 Teflon plate |
| | T3-PI | nitrogen atmosphere, 3 Teflon plates |
| | T5-P1 | nitrogen atmosphere, 5 Teflon plates |
| | T7-PI | nitrogen atmosphere, 7 Teflon plates |
| Samples obtained by altering irradiation amount of electron beam | T3-PI-20 | nitrogen atmosphere, 3 Teflon plates E-beam irradiation amount of 20 kGy |
| | T3-PI-50 | nitrogen atmosphere, 3 Teflon plates E-beam irradiation amount of 50 kGy |
| | T3-PI-150 | nitrogen atmosphere, 3 Teflon plates E-beam irradiation amount of 150 kGy |
| | T3-PI-200 | nitrogen atmosphere, 3 Teflon plates E-beam irradiation amount of 200 kGy |

TABLE 1-continued

Color filter sample names and curing conditions

| Color filter sample name | | Curing conditions |
|---|---|---|
| Samples on plastic substrate (PC) | T0PC-PI | nitrogen atmosphere, No Teflon plate |
| | T0PC-PIX | air atmosphere, No Teflon plate |
| | T3PC-PI | nitrogen atmosphere, 3 Teflon plates |
| | T3PC-PIX | air atmosphere, 3 Teflon plates |
| | TRPC-PI | nitrogen atmosphere, electron beam irradiated from below a surface of a substrate where a color filter is not coated, that is, from the rear side of the substrate |
| | TRPC-PIX | air atmosphere, electron beam irradiated from below a surface of a substrate where a color filter is not coated, that is, from the rear side of the substrate |

Common features of the color filter samples listed in Table 1 are as follows.

The color filter samples were coated to a thickness of 1.5 μm by spin coating.

The substrate was a Corning 1737 glass substrate (0.7 mm) or a plastic substrate (poly carbonate).

Generally, the electron beam was irradiated at an irradiation energy of 1 MeV and an irradiation amount of 100 kGy. In different cases, the irradiation energies thereof are stated.

The color filter samples were commercially available color resists.

In each of the color filter names, "-PI" indicates that only the nitrogen or argon atmosphere was used to prevent the color filter samples from contacting oxygen in air during irradiation of the electron beam, and "-PIX" indicates that the electron beam was irradiated in air.

The color filter samples were red color filter resists.

In each of the color filter names, "n" of "Tn-" indicates the number of Teflon plates (each 300 μm) used for adjusting the electron beam energy. That is, T0-, T1-, T3-, T5-, and T7- indicate irradiation of the electron beam was performed with 0, 1, 3, 5, and 7 Teflon plates, and TR- indicates that the electron beam was irradiated from below the surface of the substrate where the color filter was not coated, that is, from the rear surface of the substrate.

EXAMPLE 1

Curing by Electron Beam Irradiation to a Color Filter Sample on a Glass Substrate (1) Step 1 in Example 1: Coating and Drying a Color Filter on the Glass Substrate As in a typical method of fabricating a color filter, a resist for forming a red color filter provided as a color filter sample was coated to a thickness of 1.5 μm and dried on a glass substrate (Corning 1730, 0.7 mm in thickness).

Figure 12:
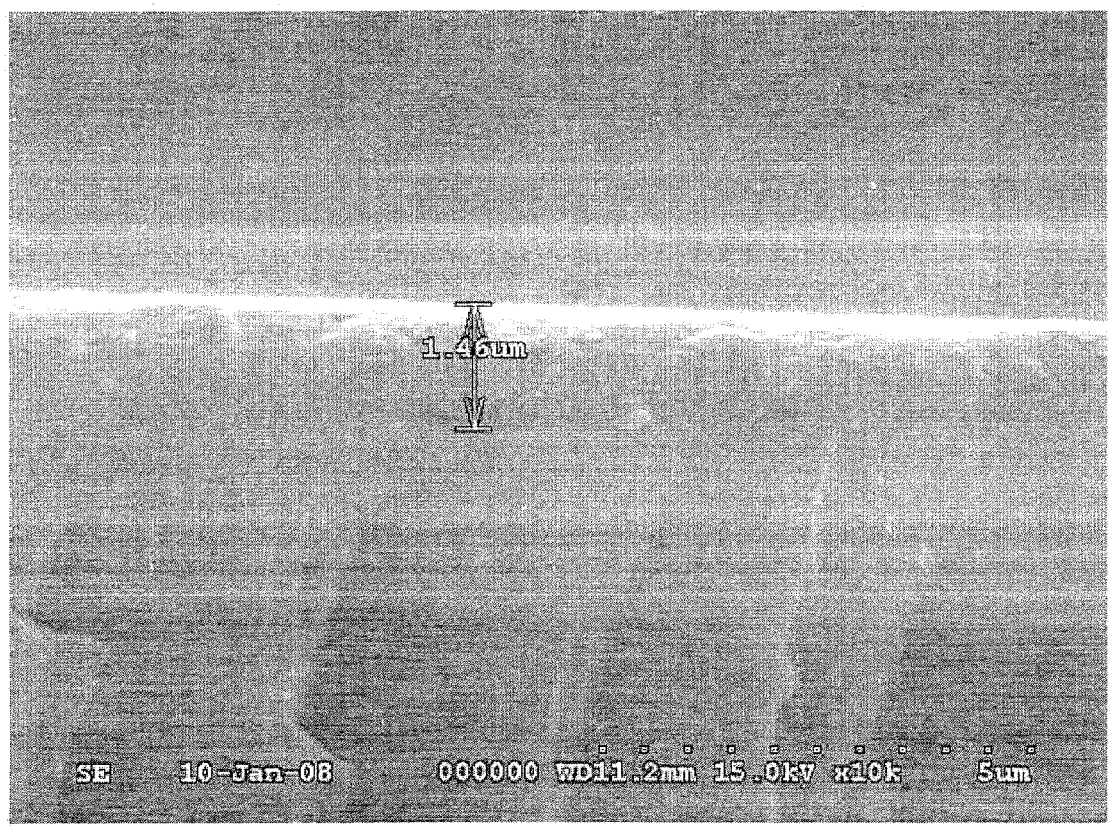
FIG. 12 is an SEM image of a color filter sample coated to a thickness of 1.5 µm according to one embodiment of the present invention.

FIG. 12 is an SEM image of the color filter sample coated to a thickness of 1.5 μm in this example.

Next, Fourier transform infrared spectroscopy (FT-IR) was used for analysis before irradiation of an electron beam.

Figure 13:
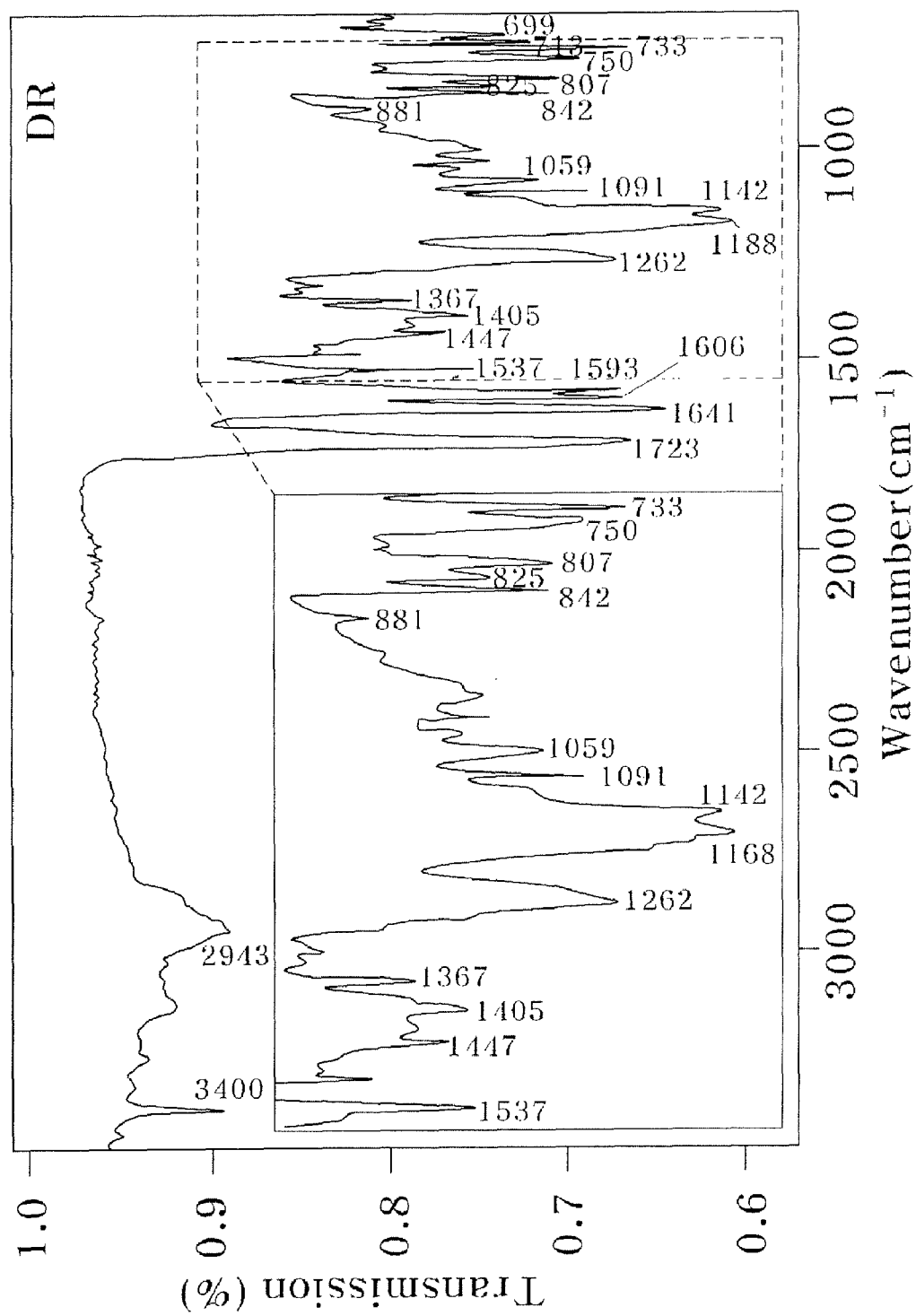
FIGS. 13 and 14 are graphs depicting FT-IR analysis results on color filter resist samples of Dongwoo Fine-Chemicals Co. Ltd., Korea, and JSR Co. Ltd., Japan.
Figure 14:
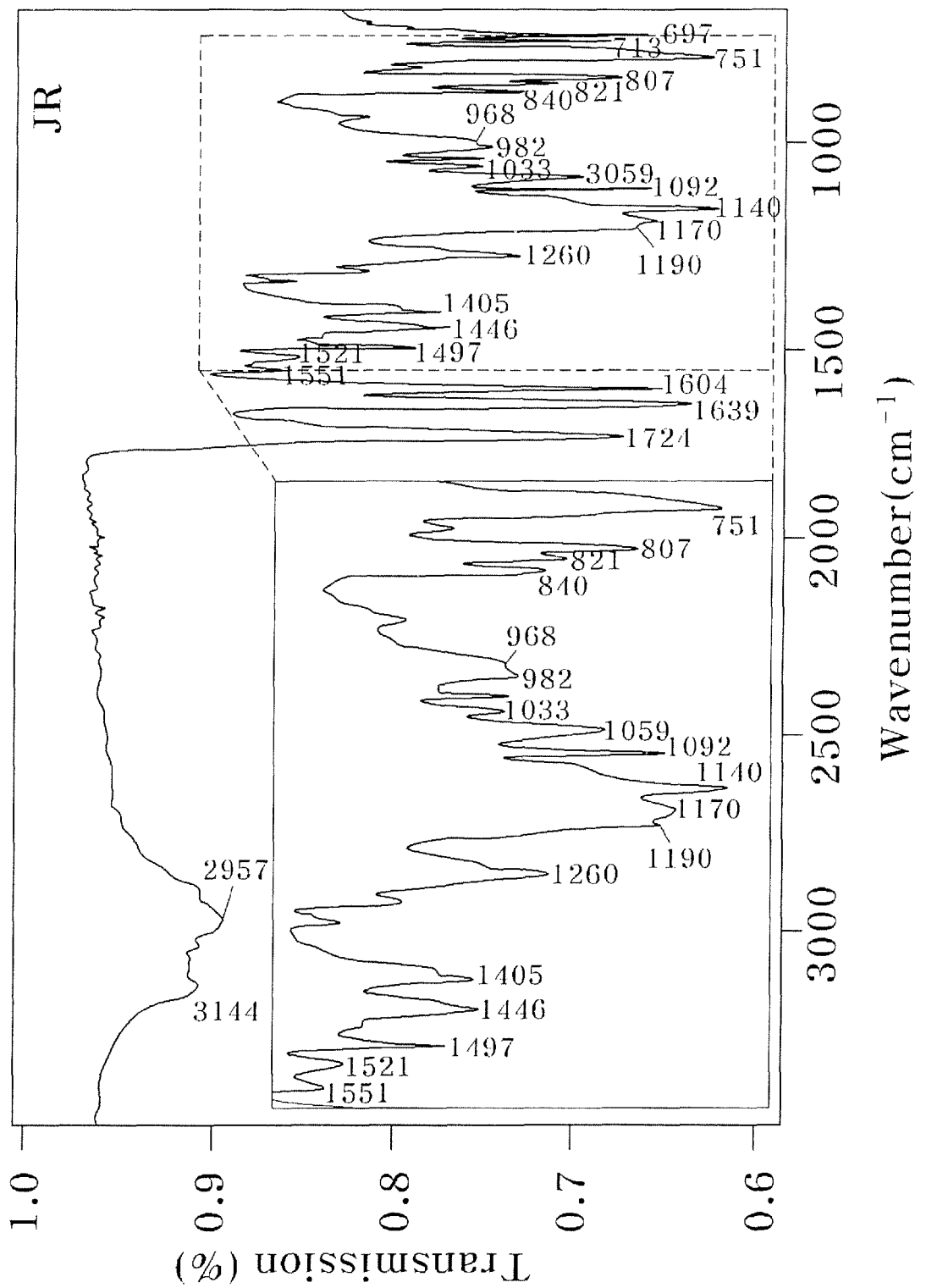

FIGS. 13 and 14 are graphs depicting FT-IR analysis results on color filter resist samples of Dongwoo Fine-Chemicals Co. Ltd., Korea, and JSR Co. Ltd., Japan.

Herein, since the color filter resists of Dongwoo Fine-Chemicals Co. Ltd., Korea and JSR Co. Ltd, Japan are representative color filters in the art, they were adopted and compared. Hence, if all of the samples exhibit the same FT-IR pattern, it can be concluded that the samples were made of the same materials.

In FIG. 13, DR indicates the color filter resist of Dongwoo Fine-Chemicals Co. Ltd., and in FIG. 14, JR indicates the color filter resist of JSR Co. Ltd. Referring to the graphs, two samples exhibit a substantially similar pattern although they were obtained from different manufacturers. It could be confirmed from an FT-IR library database that organic molecular components were PPMA-based polymer materials such as polyethyl methacrylate, polyvinyl naphthalene methacrylate, polybutyl methacrylate, and the like.

Peaks (transmission %) of wavenumbers 1604 $cm^{-1}$ and 1640 $cm^{-1}$ in the spectra of FIGS. 13 and 14 were provided not from PMMA, but from pigments and additives. As exhibited only on FT-IR of some commercial color filter samples, an IR absorption peak, 3400 $cm^{-1}$, is provided from amine or amide.

Further, as characteristic absorption peaks on FT-IR of acrylate cross-linkable monomers, absorption peaks of carbon double bonds (>C=C<), 807 $cm^{-1}$ and 1405 $cm^{-1}$, was noticeably observed from both samples.

Accordingly, when electron beam curing of this invention was carried out on the color filter samples, the acrylate cross-linkable monomer was polymerized, so that absorption peaks of carbon double bonds (>C=C<) of the acrylate cross-linkable monomer, 807 $cm^{-1}$ and 1405 $cm^{-1}$, exhibited very low intensities when the polymerization of the cross-linkable monomer was completed. From FIGS. 13 and 14, it can be seen that the two peaks of the color filter samples before polymerization exhibit high intensities.

(2) Step 2 in Example 1: Electron Beam Curing

As in Step 1 of Example 1, electron beam curing was performed with respect to the color filter samples coated and dried on the glass substrate. At this time, the electron beam had a curing energy of 1 MeV.

Next, as shown in FIG. 10, transparent Teflon plates, plastic plates or glass plates were disposed above the substrate coated with the color filter samples to adjust the intensity of the electron beam. Here, the Teflon plates were stacked to a total thickness of 0~2,100 μm by stacking 0, 1, 3, 4, 5, 6, or 7 Teflon plates in order to adjust the intensity of the electron beam reaching each of the color filter samples.

Next, after irradiating an electron beam having a total irradiation amount of 100 kGy in an atmosphere of nitrogen (N2) or argon (Ar) to prevent the color filter samples from contacting oxygen in air, curing degrees of the color filter samples were analyzed with FT-IR.

Figure 15:
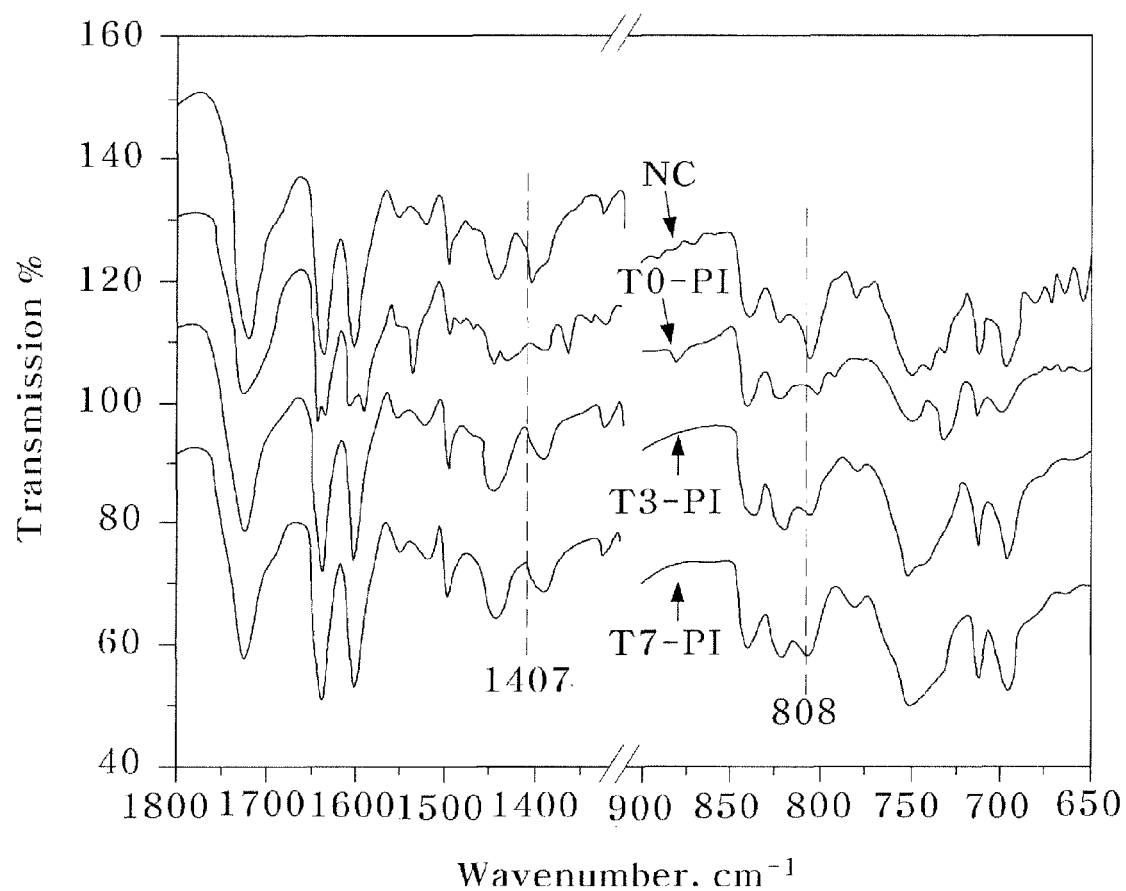
FIG. 15 is a graph depicting an FT-IR analysis result on curing degrees of color filter samples after irradiation of an electron beam.

FIG. 15 is a graph depicting FT-IR analysis results on curing degrees of the color filter samples after electron beam irradiation.

FIG. 15 shows FT-IR patterns of the color filter samples, that is, a color filter sample NC before electron beam irradiation, and color filter samples where no Teflon plate was disposed (T0-T1), and 3 and 7 Teflon plates having a thickness of 300 μm were disposed (T3-PI, T7-PI), respectively.

In this manner, by comparing the FT-IR analysis results before and after the electron beam irradiation, the curing degrees of the color filter samples by the electron beam can be obtained. The polymerization degrees of the color filter samples by thermal-heating or electron beam irradiation can be determined according to the intensity of FT-IR absorption peak (Transmission %) of the acrylate cross-linkable monomer. Thus, when polymerization of the cross-linkable monomer was completed, absorption peaks of carbon double bonds (>C=C<) of the acrylate cross-linkable monomer, 807 $cm^{-1}$ and 1405 $cm^{-1}$, exhibited very low intensities.

From color filter sample NC before the electron beam irradiation, absorption peaks of the acrylate cross-linkable monomer, 807 cm$^{-1}$ and 1405 cm$^{-1}$, were very highly observed. On the other hand, for color filter sample T3-PI where 3 Teflon plates having a thickness of 300 μm were disposed, absorption peaks of the acrylate cross-linkable monomer, 807 cm$^{-1}$ and 1405 cm$^{-1}$, were not substantially observed. This shows that this color filter sample had a very high curing degree due to the electron beam curing.

On the other hand, for color filter samples T0-PI and T7-PI where no Teflon plate was disposed and 7 Teflon plates were disposed, respectively, the absorption peaks of the acrylate cross-linkable monomer was more highly observed than color filter sample T3-PI. Thus, it can be understood that the curing degrees of these color filter samples were reduced below that of color filter sample T3-PI.

EXAMPLE 2

Electron Beam Irradiation From the Rear Side of the Glass Substrate

An electron beam having a curing energy of 1 MeV was irradiated at a total irradiation amount of 100 kGy to the color filter samples prepared as in Example 1 from the rear side of the glass substrate to adjust the energy of the electron beam as shown in FIG. 11.

Figure 16:
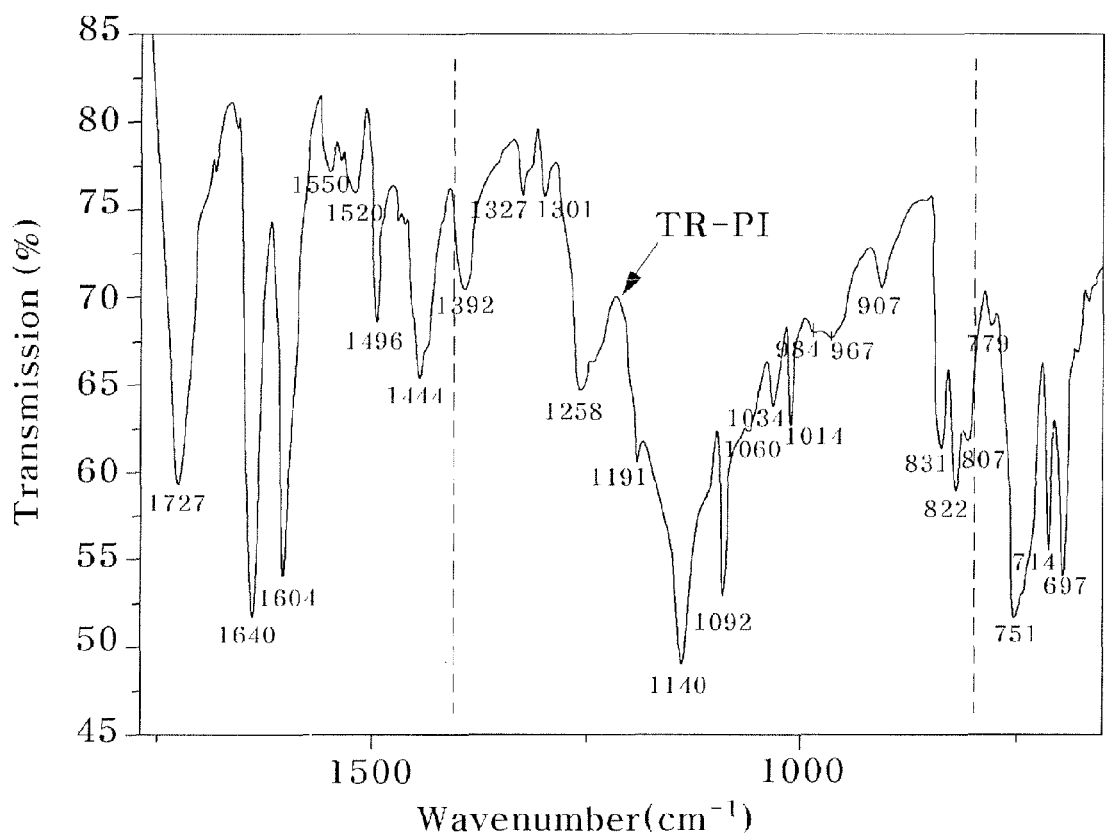
FIG. 16 is a graph depicting an FT-IR analysis result on a color filter sample (TR-PI) when an electron beam was irradiated from a rear side of a glass substrate.

FIG. 16 is a graph depicting an FT-IR analysis result on color filter sample TR-PI when the electron beam was irradiated from the rear side of the glass substrate.

In FIG. 16, absorption peaks of the acrylate cross-linkable monomer, 807 cm$^{-1}$ and 1405 cm$^{-1}$, are not substantially observed.

COMPARATIVE EXAMPLE 1

Curing a Red Color Filter Sample Formed on a Glass Substrate by a Conventional Thermal-Heating Method To compare polymerization effect of a color filter by electron beam curing with that of the conventional thermal-heating method, a color filter prepared as in Step 1 of Example 1 was heated at 200° C. for 25 minutes, followed by curing, thereby preparing color filter sample T200.

Figure 17:
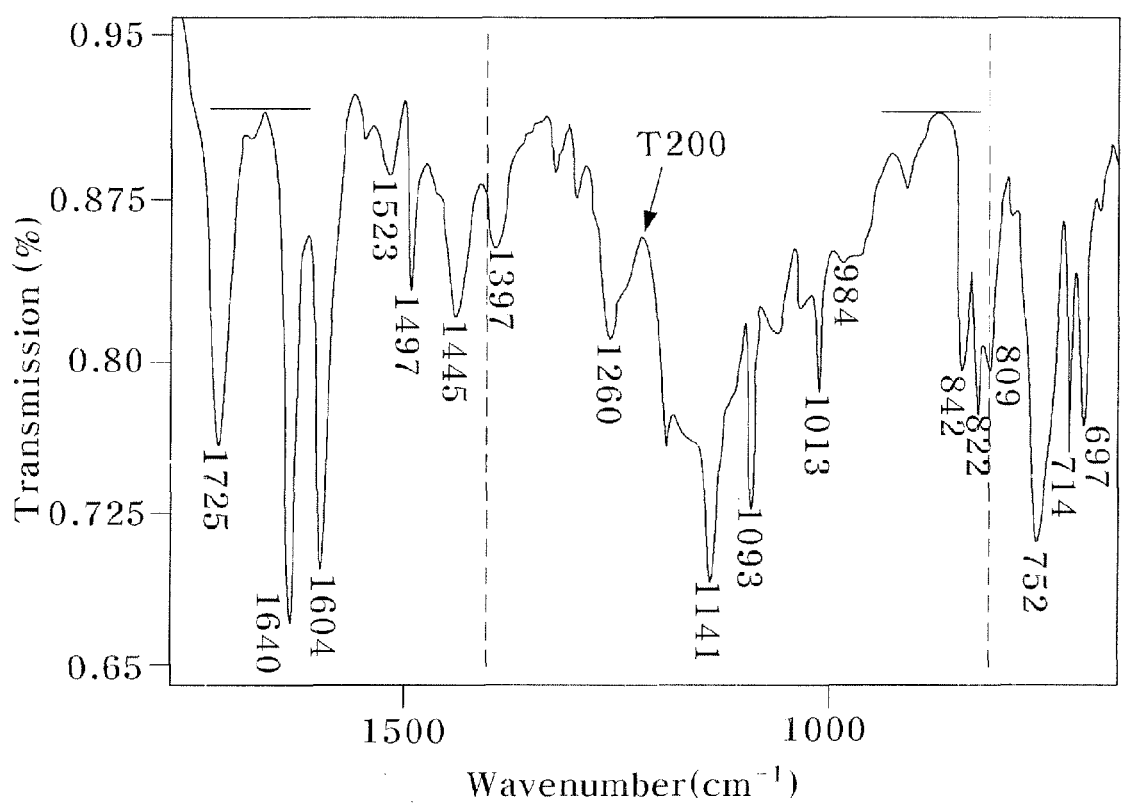
FIG. 17 is a graph depicting an FT-IR analysis result on a color filter sample of Comparative Example 1 after curing.

FIG. 17 is a graph depicting an FT-IR analysis result on a color filter sample of Comparative Example 1 after curing.

Referring to FIG. 17, for color filter sample T200 heated at 200° C. for curing, C=C double bond absorption peaks, 807 cm$^{-1}$ and 1405 cm$^{-1}$, also exhibited remarkably reduced intensities, as in color filter samples TR-PI and T3-PI subjected to the electron beam curing.

Here, although the intensity reduction of the sample T200 appears similar to the effect of the present invention, the absorption peaks of the color filter samples subjected to the electron beam curing in the inventive examples exhibit remarkably lower intensities than those of the sample T200 obtained by the conventional thermal-heating method. This shows that the color filter curing according to this invention is superior to the conventional technique.

Figure 18A:
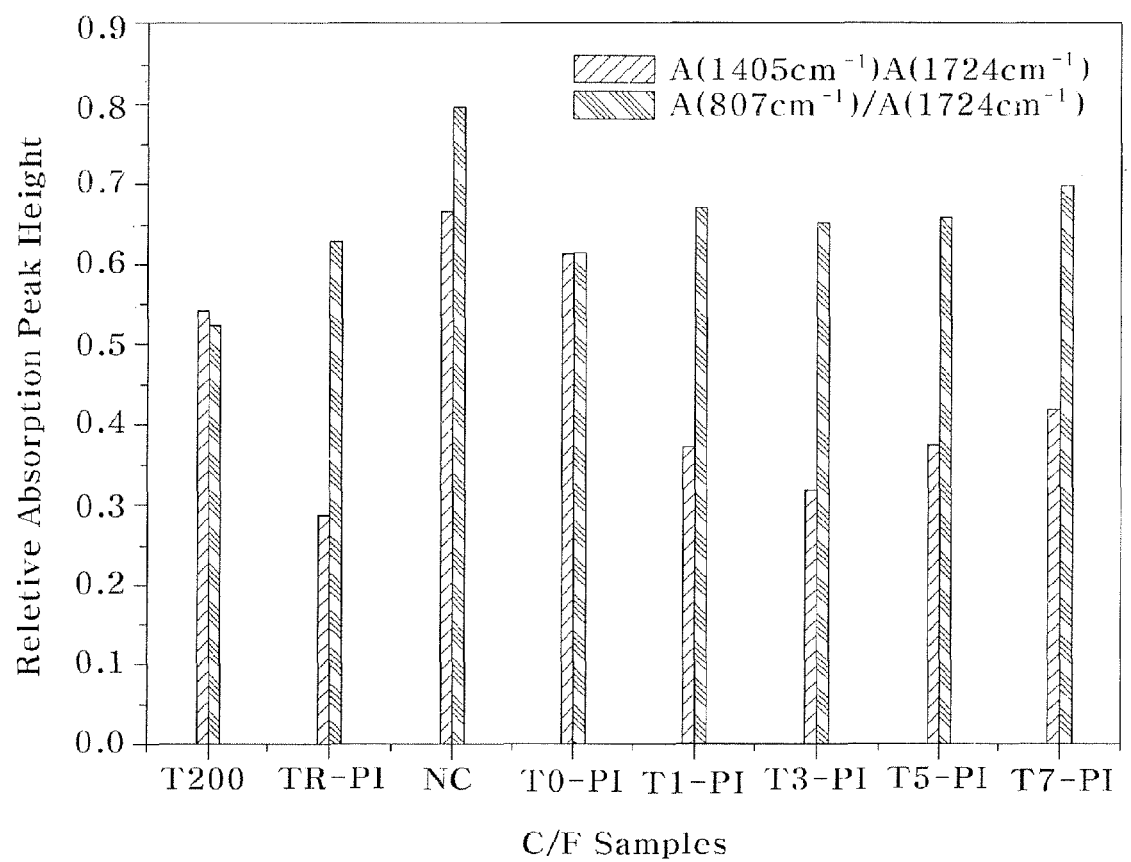
FIGS. 18a and 18b are graphs depicting polymerization degrees of color filter samples of Examples 3 and 4, and Comparative Example 1, as obtained from quantitative analysis results on FT-IR patterns of the color filter samples, respectively.
Figure 18B:
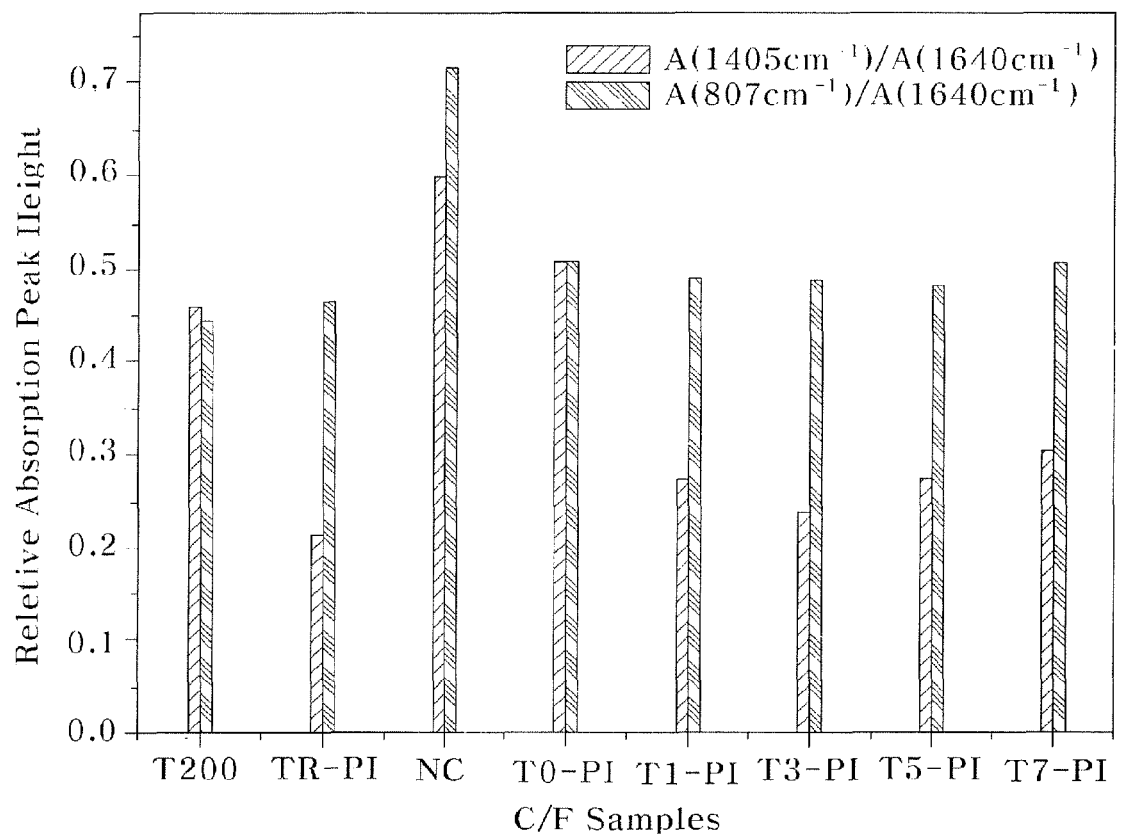

FIGS. 18a and 18b are graphs depicting polymerization degrees of color filter samples of Examples 3 and 4, and Comparative Example 1, as obtained from quantitative analysis results on FT-IR patterns of the color filter samples, respectively.

The quantitative analysis on the polymerization degrees of color filter samples (C/F samples) can also be obtained from the intensities of double bonds (>C=C<) absorption peaks of the acrylate cross-linkable monomer, 807 cm$^{-1}$ and 1405 cm$^{-1}$. The quantitative analysis of the polymerization degree was performed according to relative absorption peak heights A(1405 cm$^{-1}$)/A(1724 cm$^{-1}$), A(807 cm$^{-1}$)/A(1724 cm$^{-1}$), A(1405 cm$^{-1}$)/A(1640 cm$^{-1}$), and A(807 cm$^{-1}$)/A(1640 cm$^{-1}$), which are obtained by dividing intensities (heights) of peaks, 807 cm$^{-1}$ and 1405 cm$^{-1}$, by intensities (heights) of non-acrylate absorption peaks, 1640 cm$^{-1}$ and 1722 cm$^{-1}$ (stretching mode of carbonyl group >C=O). At this time, the intensity of peak 807 cm$^{-1}$ was measured with reference to an adjacent base line, ~840 cm$^{-1}$, and the intensity of peak 1405 cm$^{-1}$ was measured with reference to an adjacent base line, ~1664 cm$^{-1}$.

The color filter samples (C/F samples) shown in FIGS. 18a and 18b were all irradiated under conditions of 100 kGy and 1 MeV in a nitrogen atmosphere to prevent the color filter samples from contacting air.

The polymerization degrees were quantitatively analyzed and compared with one another for color filter sample T-200 prepared by the conventional thermal-heating method, color filter samples T0-PI, T3-PI, T5-PI and T7-PI where no Teflon plate was disposed, and where 3, 5 and 7 Teflon plates having a thickness of 300 μm were provided, respectively, and for color filter sample TR-PI to which the electron beam was irradiated from the rear side of the glass substrate. According to the relative absorption peak heights of absorption peaks 807 cm$^{-1}$ and 1405 cm$^{-1}$, that is, A(1405 cm$^{-1}$)/A(1724 cm$^{-1}$), A(807 cm$^{-1}$)/A(1724 cm$^{-1}$), A(1405 cm$^{-1}$)/A(1640 cm$^{-1}$) and A(807 cm$^{-1}$)/A(1640 cm$^{-1}$), color filter samples T3-PI and TR-PI had the highest polymerization degrees above color filter sample T-200 obtained by heating at 200° C. This result shows that the color filter curing according to the present invention provides the same polymerization effects as or superior polymerization effects to the conventional technique, such as curing by thermal-heating at 200° C. or the like.

EXAMPLE 3

Electron Beam Curing of Color Filters Coated on a Glass Substrate (Effect Dependent on Irradiation Amount of Electron Beam)

With color filter samples coated on the glass substrate under the same conditions as Example 1, a total irradiation amount of electron beam was varied from 20 to 50, 150 and 200 kGy in order to obtain an effective irradiation amount for polymerization. After irradiation of the electron beam, the polymerization degrees of the color filter samples were analyzed based on FT-IR.

Figure 19:
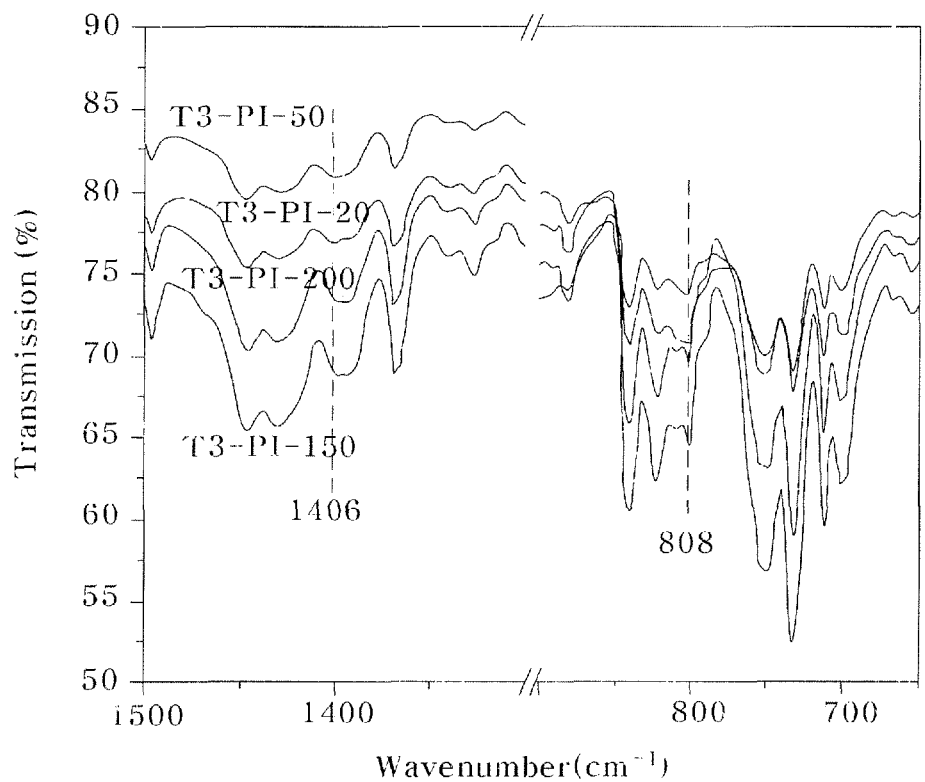
FIG. 19 is a graph depicting an FT-IR analysis result on curing degrees of color filter sampled after irradiating an electron-beam according to a condition of Example 3.

FIG. 19 is a graph depicting an FT-IR analysis result on curing degrees of color filter samples after irradiating an electron-beam according to a condition of Example 3.

Referring to FIG. 19, it can be seen that the most effective condition for polymerization of the color filter was obtained at about 50~100 kGy (T3-PI-20, T3-PI-50), and that the polymerization degree was not significantly increased at 100 kGy or more (T3-PI-150, T3-PI-200). For color filter sample T3-PI-20 at an irradiation amount of 20 kGy, the intensity of 807 cm$^{-1}$ peak was higher than other peaks.

EXAMPLE 4

Electron Beam Curing of Color Filters Coated on a Plastic Substrate

With color filter samples coated and dried on a polycarbonate (PC) substrate having a thickness of 200 μm under the same conditions as Example 1, an electron beam was irradiated at an energy of 1 MeV and a total irradiation amount of 100 kGy to each of the color filter samples. The electron beam was irradiated to color filter sample T3PC-PI with 3 Teflon plates (900 μm) disposed above the plastic substrate, and to color filter sample T0PC-PI without any Teflon plate.

Figure 20:
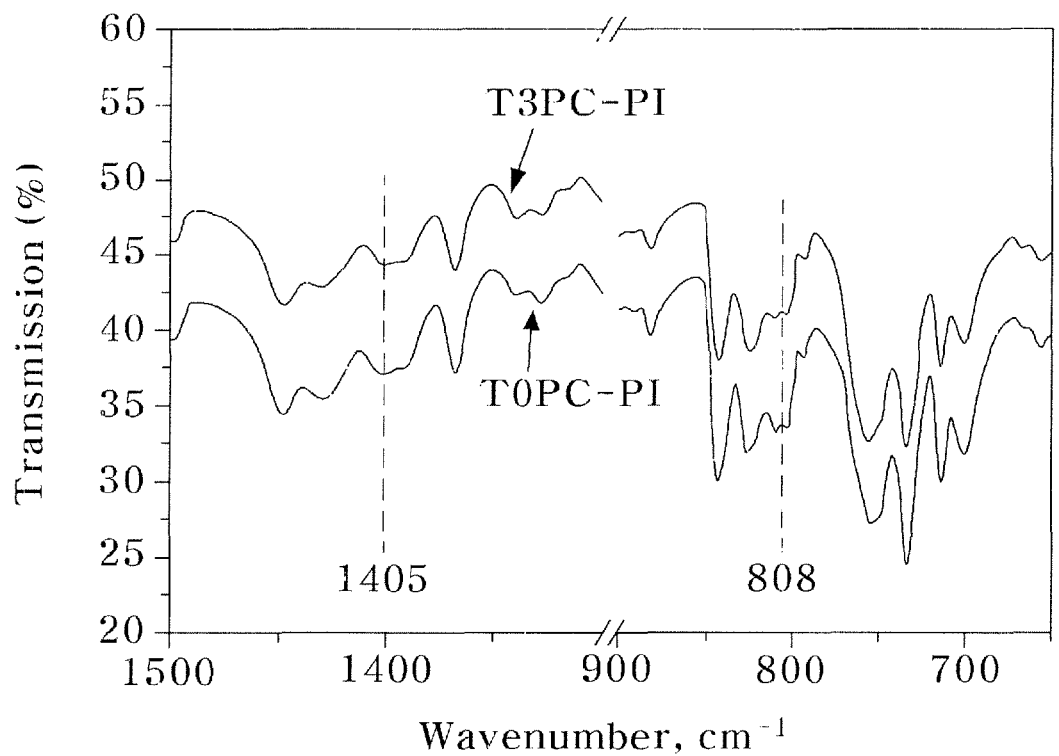
FIG. 20 is a graph comparing FT-IR analysis results of two color filter samples in Example 4.

FIG. 20 is a graph comparing FT-IR analysis results of two color filter samples in Example 4.

Referring to FIG. 20, 807 $cm^{-1}$ and 1405 $cm^{-1}$ peaks of color filter sample T3PC-PI with 3 Teflon plates (900 μm) disposed above the plastic substrate were remarkably reduced below those of color filter sample T0PC-PI.

EXAMPLE 5

Electron Beam Irradiation From the Rear Side of the Plastic Substrate

As in Example 4, an electron beam having an energy of 1 MeV was irradiated at a total irradiation amount of 100 kGy to color filter samples. When irradiating the electron beam from the rear side of the polycarbonate (PC) substrate having a thickness of 200 μm to the color filter samples coated on the substrate, the electron beam was irradiated in a nitrogen atmosphere (color filter sample TRPC-PI) and in an air atmosphere (color filter sample TRPC-PIX).

Figure 21:
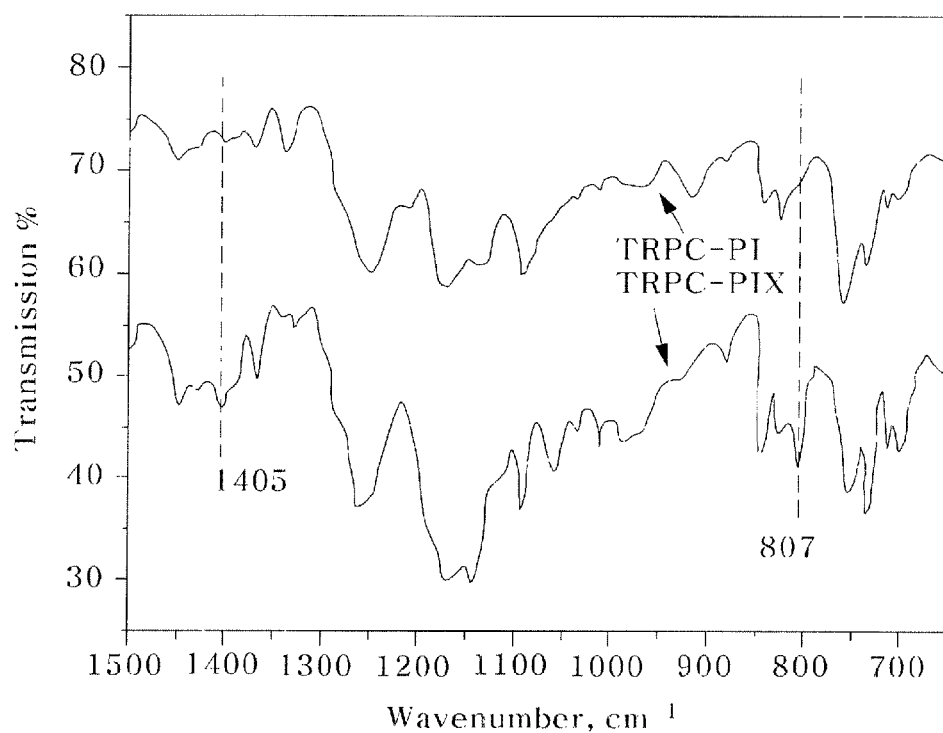
FIG. 21 is a graph comparing FT-IR analysis results of two color filter samples in Example 5.

FIG. 21 is a graph comparing FT-IR analysis results of two color filter samples in Example 5.

Referring to FIG. 21, for color filter sample TRPC-PI where the electron beam was irradiated in the nitrogen atmosphere, 807 $cm^{-1}$ and 1405 $cm^{-1}$ peaks were significantly reduced in height. On the other hand, for color filter sample TRPC-PIX where the electron beam was irradiated in the air atmosphere, 807 $cm^{-1}$ and 1405 $cm^{-1}$ peaks were highly exhibited.

Figure 22A:
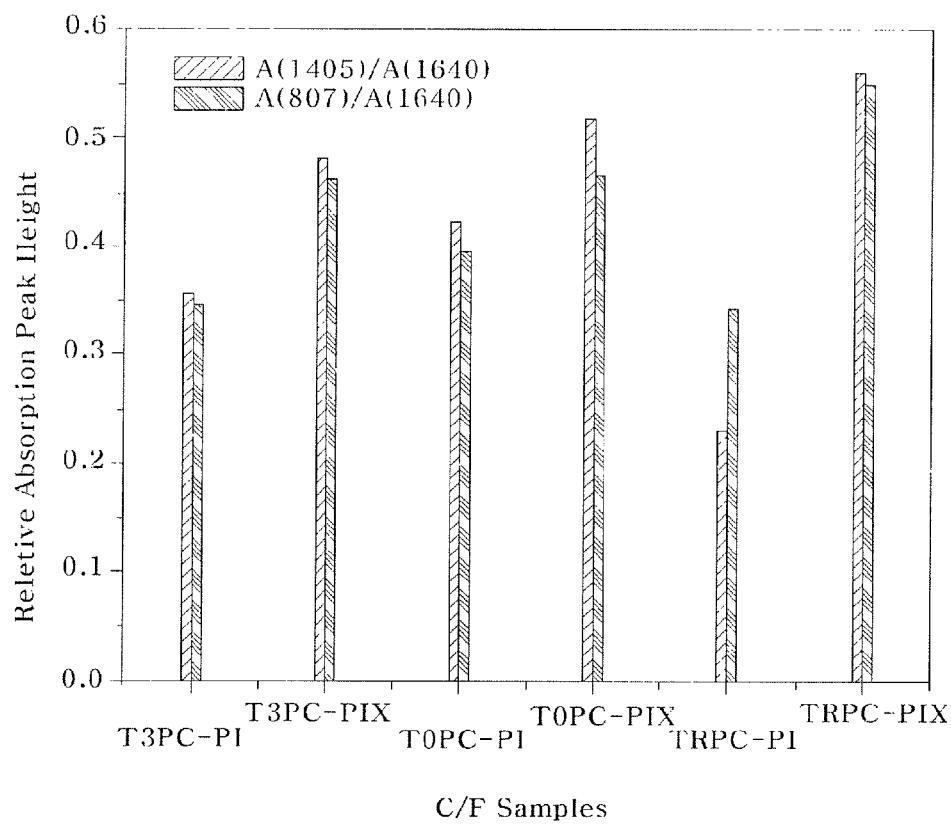
FIGS. 22a and 22b are graphs depicting polymerization degrees of the color filter samples coated on the plastic substrate in Examples 4 and 5, as obtained from quantitative analysis results on FT-IR patterns of the color filter samples, respectively.
Figure 22B:
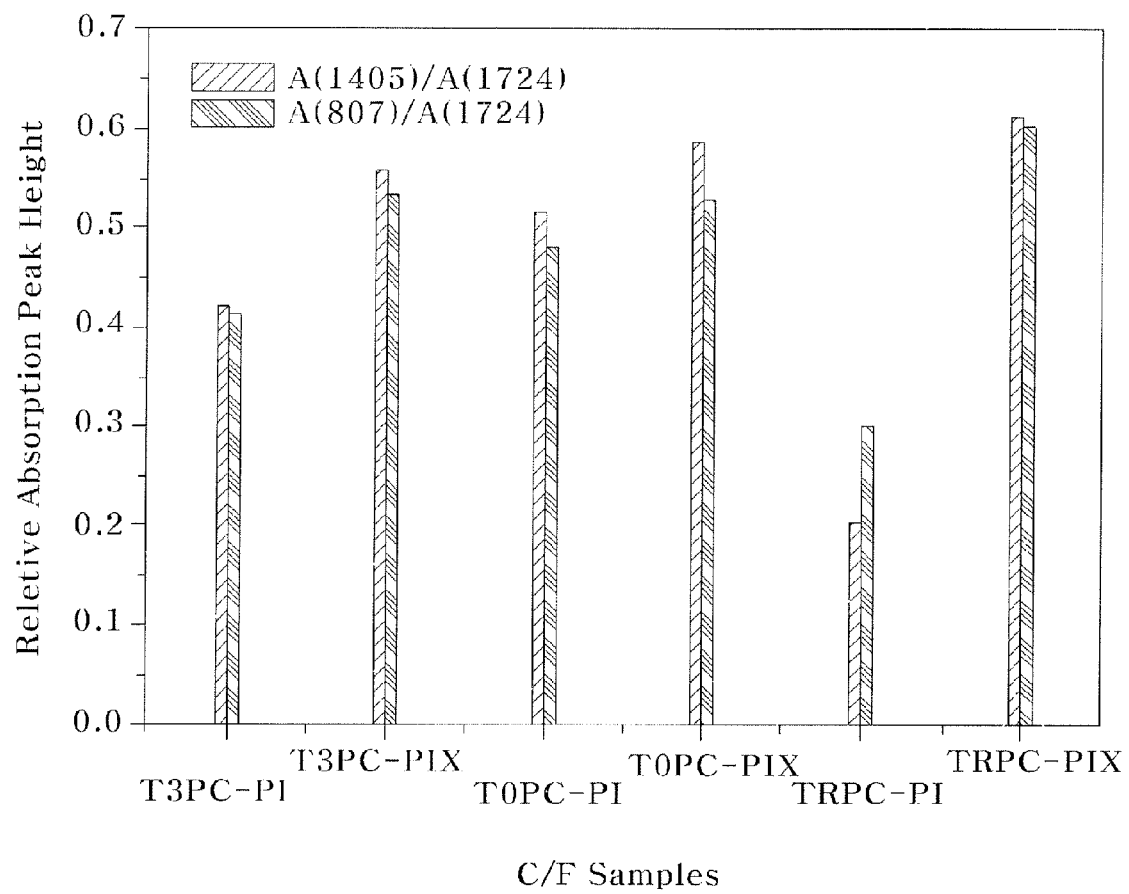

FIGS. 22a and 22b are graphs depicting polymerization degrees of the color filter samples coated on the plastic substrate in Examples 4 and 5, as obtained from quantitative analysis results on FT-IR patterns of the color filter samples, respectively.

Referring to FIGS. 22a and 22b, the quantitative analysis on the polymerization degrees was performed as shown in FIGS. 18a and 18b. In this analysis, color filter sample TCPC-PI obtained by irradiating the electron beam from the rear side of the plastic substrate had the highest degree of polymerization. Therefore, it can be understood that the electron beam curing of this invention ensures superior curing properties (degree of polymerization) to color filter sample T-200 obtained by heating at 200° C. as in the prior art.

Accordingly, the electron beam curing method of the present invention, and the color filter for electronic displays fabricated using the method can ensure precise and fine dimensions of the color patterns, thereby realizing more precise pixels. Furthermore, the present invention prevents deformation of the color filter for flexible displays, thereby providing more freedom in designing the display.

As apparent from the above description, instead of curing a color filter by thermal-heating at about 200° C. as in the prior art when fabricating color filters (R, G, B, BM) on a plastic or glass substrate, the method according to the present invention employs a non-thermal heating method at 100° C. or less for curing the color filter. The electronic-beam curing technique of this invention provides a similar or superior polymerization degree of the color filter to that of the conventional thermal-heating method. Accordingly, the electronic-beam curing technique enables the curing process of the color filter patterns formed on the plastic substrate to be performed at a thermally stable temperature or less.

Additionally, the electron-beam curing technique of the present invention can be used not only for curing the color filter patterns, but also for patterning a color filter including a black matrix (BM), thereby enabling simplification of manufacturing equipment through replacement of conventional lithography and curing apparatuses with a single instrument.

Although the present invention has been described with reference to the embodiments and the accompanying drawings, it will be apparent to those skilled in the art that the embodiments are given by way of illustration, and that various modifications and equivalent embodiments can be made without departing from the spirit and scope of the present invention, as defined only by the accompanying claims.

What is claimed is:

1. A method of curing a color filter for an electronic display using an electron beam at low temperature, comprising:
forming a red pattern, a green pattern, a blue pattern, or a black matrix pattern on a substrate; and
irradiating an electron beam to the red pattern, the green pattern, the blue pattern, or the black matrix pattern at an energy of 0.01~3 MeV and an irradiation amount of 10~500 kGy in the range of room temperature to 100° C. to perform a curing process,
wherein the electron beam is irradiated from above the red pattern, the green pattern, the blue pattern, or the black matrix pattern toward the substrate,
wherein a transparent polytetrafluoroethylene (PTFE) plate, plastic plate or glass plate is disposed above the red pattern, the green pattern, the blue pattern, or the black matrix pattern to adjust an energy of the electron beam.

2. The method according to claim 1, wherein the substrate is a glass or plastic substrate having a thickness of 80~3,000 μm.

3. The method according to claim 1, wherein the red pattern, the green pattern, the blue pattern, or the black matrix pattern is formed by an exposure process using the electron beam or ultraviolet (UV) irradiation.

4. The method according to claim 1, wherein the red pattern, the green pattern, the blue pattern, or the black matrix pattern is formed to a thickness of 1.5~1.7 μm.

5. The method according to claim 1, wherein the transparent PTFE plate, plastic plate or glass plate has a thickness of 10~2,100 μm, and a total number of 1 to 7 PTFE plates, plastic plates or glass plates are provided.

6. The method according to claim 1, wherein, while the electron beam is irradiated, an inert gas comprising nitrogen or argon is brought into contact with a surface of the red pattern, the green pattern, the blue pattern, or the black matrix pattern.

7. A method of curing a color filter for an electronic display using an electron beam at low temperature, comprising:
forming a red pattern, a green pattern, a blue pattern, or a black matrix pattern on a substrate by an exposure process using an electron beam; and
irradiating the electron beam to the red pattern, the green pattern, the blue pattern, or the black matrix pattern at an energy of 0.01~3 MeV and an irradiation amount of 10~500 kGy in the range of room temperature to 100° C. to perform a curing process,
wherein the electron beam is irradiated from a rear side of the substrate to the red pattern, the green pattern, the blue pattern, or the black matrix pattern through the substrate.

8. A method of fabricating a color filter for an electronic display, comprising:
- coating a resist for forming the color filter on a substrate;
- pre-baking the resist;
- exposing and developing the pre-baked resist to form a color filter pattern; and
- irradiating an electron beam to the color filter pattern at an energy of 0.01~3 MeV and an irradiation amount of 10~500 kGy in the range of room temperature to 100° C. to perform a curing process,
- wherein the electron beam is irradiated from above the color filter pattern toward the substrate,
- wherein a transparent polytetrafluoroethylene (PTFE) plate, plastic plate or glass plate is disposed above the color filter pattern to adjust an energy of the electron beam.

9. The method according to claim 8, wherein the resist comprises an acrylate monomer or oligomer.

10. A method of fabricating a color filter for an electronic display, comprising:
- coating a resist for forming the color filter on a substrate;
- pre-baking the resist;
- exposing and developing the pre-baked resist to form a color filter pattern; and
- irradiating an electron beam to the color filter pattern at an energy of 0.01~3 MeV and an irradiation amount of 10~500 kGy in the range of room temperature to 100° C. to perform a curing process, the electron beam being irradiated from a rear surface of the substrate, where the resist is not formed, to the color filter pattern through the substrate.

11. The method according to claim 10, wherein the resist comprises an acrylate monomer or oligomer.

12. A method of fabricating a color filter for an electronic display, comprising:
- coating a resist for forming the color filter on a substrate;
- pre-baking the resist;
- exposing the pre-baked resist to form a color filter pattern while irradiating an electron beam at an energy of 0.01~3 MeV and an irradiation amount of 10~500 kGy to the color filter pattern in the range of room temperature to 100° C. to perform an exposure process and a curing process at the same time, wherein the electron beam is irradiated from above the color filter pattern toward the substrate, wherein a transparent polytetrafluoroethylene plate, plastic plate or glass plate is disposed above the color filter pattern to adjust an energy of the electron beam; and
- removing the resist except for the color filter pattern by a development process.

13. The method according to claim 12, wherein the resist comprises an acrylate monomer or oligomer.

* * * * *